(12) United States Patent
Lee et al.

(10) Patent No.: US 7,936,332 B2
(45) Date of Patent: May 3, 2011

(54) GATE DRIVING CIRCUIT HAVING REDUCED RIPPLE EFFECT AND DISPLAY APPARATUS HAVING THE SAME

(75) Inventors: Min-Cheol Lee, Seoul (KR); Seung-Hwan Moon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 857 days.

(21) Appl. No.: 11/763,144

(22) Filed: Jun. 14, 2007

(65) Prior Publication Data
US 2007/0296662 A1    Dec. 27, 2007

(30) Foreign Application Priority Data

Jun. 21, 2006 (KR) .................. 10-2006-0055654
May 29, 2007 (KR) .................. 10-2007-0051904

(51) Int. Cl.
*G09G 3/36* (2006.01)
(52) U.S. Cl. ........................................ 345/100
(58) Field of Classification Search ............ 345/87–104; 377/64–81; 315/169.1–169.2; 349/42, 43, 349/151, 152
See application file for complete search history.

(56) References Cited

U.S. PATENT DOCUMENTS

| | | | | |
|---|---|---|---|---|
| 6,611,248 B2 * | 8/2003 | Kanbara et al. | ............... | 345/100 |
| 2003/0189542 A1 * | 10/2003 | Lee et al. | ............... | 345/93 |
| 2005/0275609 A1 | 12/2005 | Lee | | |
| 2006/0022201 A1 * | 2/2006 | Kim et al. | ............... | 257/72 |
| 2006/0038500 A1 * | 2/2006 | Lee et al. | ............... | 315/169.1 |
| 2006/0214901 A1 * | 9/2006 | Nagatsuka | ............... | 345/100 |

* cited by examiner

*Primary Examiner* — Chanh Nguyen
*Assistant Examiner* — Sanghyuk Park
(74) *Attorney, Agent, or Firm* — Innovation Counsel LLP

(57) ABSTRACT

In a gate driving circuit and a display apparatus, the gate driving circuit comprises a plurality of stages. At least one of the stages comprises a pull-up section responsive to a first node signal; a pull-down section responsive to a second input signal; a discharging section discharging the first node signal in response to the second input signal; a first holding section responsive to the first clock signal, maintaining the first node signal at the off-voltage; and a second holding section responsive to the second clock signal, maintaining the first node signal at the off-voltage. The second holding section has a greater transistor width-to-length ratio than the first holding section. Therefore, an abnormal gate-on signal is less likely to occur, reducing driving defects of the display apparatus.

22 Claims, 11 Drawing Sheets

US 7,936,332 B2

GATE DRIVING CIRCUIT HAVING REDUCED RIPPLE EFFECT AND DISPLAY APPARATUS HAVING THE SAME

CROSS-REFERENCE TO RELATED APPLICATIONS

This application claims priority under 35 U.S.C. §119 to Korean Patent Application No. 2006-55654, filed on Jun. 21, 2006 and Korean Patent Application No. 2007-51904, filed on May 29, 2007 in the Korean Intellectual Property Office (KIPO), the contents of are herein incorporated by reference in their entireties.

BACKGROUND OF THE INVENTION

1. Field of the Invention

The present invention relates to a gate driving circuit and a display apparatus having the gate driving circuit. In some embodiments, the gate driving circuit is capable of reducing driving defects.

2. Description of the Related Art

Generally, a liquid crystal display (LCD) apparatus includes an array substrate, a counter substrate and a liquid crystal layer disposed between the array and counter substrates. The liquid crystal layer includes liquid crystal molecules having an anisotropic dielectric constant. In the LCD apparatus, an electric field is applied to the liquid crystal molecules and light transmissivity is controlled according to the intensity of the electric field to display an image.

The LCD apparatus includes a display panel containing the array and counter substrates and further includes a gate driving circuit and a data driving circuit. The display panel includes a plurality of pixel areas defined by gate lines and data lines transverse to the gate lines. The gate driving circuit outputs gate signals to the gate lines, and the data driving circuit outputs data signals to the data lines. Generally, the gate and data driving circuits are formed as integrated circuit chips mounted on the display panel.

To decrease the LCD size and increase productivity, the gate driving circuit can be integrated directly on the display substrate. However, when such an integrated gate driving circuit is operated at high temperatures, noise can be generated in the form of an abnormal gate-on signal occurring in gate-off time.

The noise is generated due to parasitic capacitance (Cgd) between a clock signal and the gate of a pull-up transistor. This capacitance serves to increase the transistor's gate voltage when the transistor is supposed to be off. At the same time, the high temperature drives up the transistor's leakage current. As a result, the pull-up transistor turns on. The intermittent abnormal turning-on of the pull-up transistor causes display defects on the LCD.

SUMMARY OF THE INVENTION

Some embodiments of the present invention provide a gate driving circuit capable of reducing driving defects of a display apparatus, and the display apparatus having the gate driving circuit.

In some embodiments of the present invention, a gate driving circuit comprises a shift register that has a plurality of stages cascade-connected to each other. The plurality of stages comprises one or more stages, each of which comprises: a pull-up section receiving a first clock signal, and passing the first clock signal as a gate signal when a first node signal is driven to a high voltage in response to a first input signal; a pull-down section discharging the gate signal to an off-voltage in response to a second input signal; a discharging section discharging the first node signal to the off-voltage in response to the second input signal; a first holding section responsive to the first clock signal, maintaining the first node signal at the off-voltage when the gate signal has been discharged to the off-voltage; and a second holding section responsive to the second clock signal, maintaining the first node signal at the off-voltage when the first input signal is at the off-voltage, wherein the second holding section has a greater transistor width-to-length ratio than the first holding section.

In some embodiments of the present invention, a display apparatus comprises: a display panel including a display area displaying an image and a peripheral area surrounding the display area, a plurality of pixel areas being formed in the display area by gate lines and data lines transverse to the gate lines; a data driving circuit outputting data signals to the data lines; and a gate driving circuit having a plurality of stages cascade-connected to each other and directly integrated on the peripheral area, each of the stages outputting a gate signal to the gate lines, wherein the plurality of stages comprises one or more stages, each of which comprises: a pull-up section passing a first clock signal as a gate signal in response to a first node signal driven to a high level in response to a first input signal; a pull-down section discharging the gate signal to an off-voltage in response to a second input signal; a discharging section discharging the first node signal to the off-voltage in response to the second input signal; a first holding section maintaining the first node signal at the off-voltage of the gate signal in response to the first clock signal; and a second holding section maintaining the first node signal at the off-voltage of the first input signal in response to the second clock signal, wherein the second holding section has a greater transistor width-to-length ratio than the first holding section.

In some embodiments of the present invention, a gate driving circuit comprises a shift register that has a plurality of stages cascade-connected to each other, each stage comprising: a pull-up section connected to a first clock terminal connecting the first clock terminal to an output terminal providing a gate signal when a first node is driven to a high voltage in response to a signal on a first input terminal; a pull-down section discharging the output terminal to an off-voltage in response to a signal on a second input terminal; a discharging section discharging the first node to the off-voltage in response to the signal on the second input terminal; a first holding section responsive to a signal on the first clock terminal, maintaining the first node at the off-voltage when the output terminal has been discharged to the off-voltage; and a second holding section responsive to a signal on a second clock terminal, maintaining the first node at the off-voltage when the first input terminal is at the off-voltage, wherein the second holding section has a greater transistor width-to-length ratio than the first holding section.

In some embodiments of the present invention, a gate driving circuit comprises a plurality of stages cascade-connected to each other. An m-th stage (wherein 'm' is an integer) includes a pull-up section, a pull-down section, a discharging section, a first holding section and a second holding section. The pull-up section receives a first clock signal, and passes the first clock signal as a gate signal when a first node signal is driven to a high voltage in response to a first input signal. The pull-down section discharges the gate signal to an off-voltage in response to a second input signal. The discharging section discharges the first node signal to the off-voltage in response to the second input signal. The first holding section responsive to the first clock signal, maintains the first node signal at the off-voltage when the gate signal has been discharged to the off-voltage. The second holding section responsive to a second clock signal, maintains the first node signal at the off-voltage when the first input signal is at the off-voltage. The second holding section includes an asymmetric transistor.

In some embodiments of the present invention, a display apparatus comprises a display panel, a data driving section and a gate driving circuit. The data driving circuit comprises a plurality of stages cascade-connected to each other. An m-th stage (wherein 'm' is an integer) includes a pull-up section, a pull-down section, a discharging section, a first holding section and a second holding section. The pull-up section receives a first clock signal, and passes the first clock signal as a gate signal when a first node signal is driven to a high voltage in response to a first input signal. The pull-down section discharges the gate signal to an off-voltage in response to a second input signal. The discharging section discharges the first node signal to the off-voltage in response to the second input signal. The first holding section responsive to the first clock signal, maintains the first node signal at the off-voltage when the gate signal has been discharged to the off-voltage. The second holding section responsive to a second clock signal, maintains the first node signal at the off-voltage when the first input signal is at the off-voltage. The second holding section includes an asymmetric transistor.

According to some embodiments of the present invention, a ripple generated in a control electrode of the pull-up section may be decreased, so that an abnormal gate-on signal may be prevented and thus driving defects may be reduced.

Other features and advantages of the invention are discussed below. The invention is defined by the appended claims.

BRIEF DESCRIPTION OF THE DRAWINGS

The above and other features and advantages of the present invention will become more apparent when illustrated by examples discussed below with reference to the accompanying drawings, in which.

DESCRIPTION OF SOME EMBODIMENTS

Figure 1:
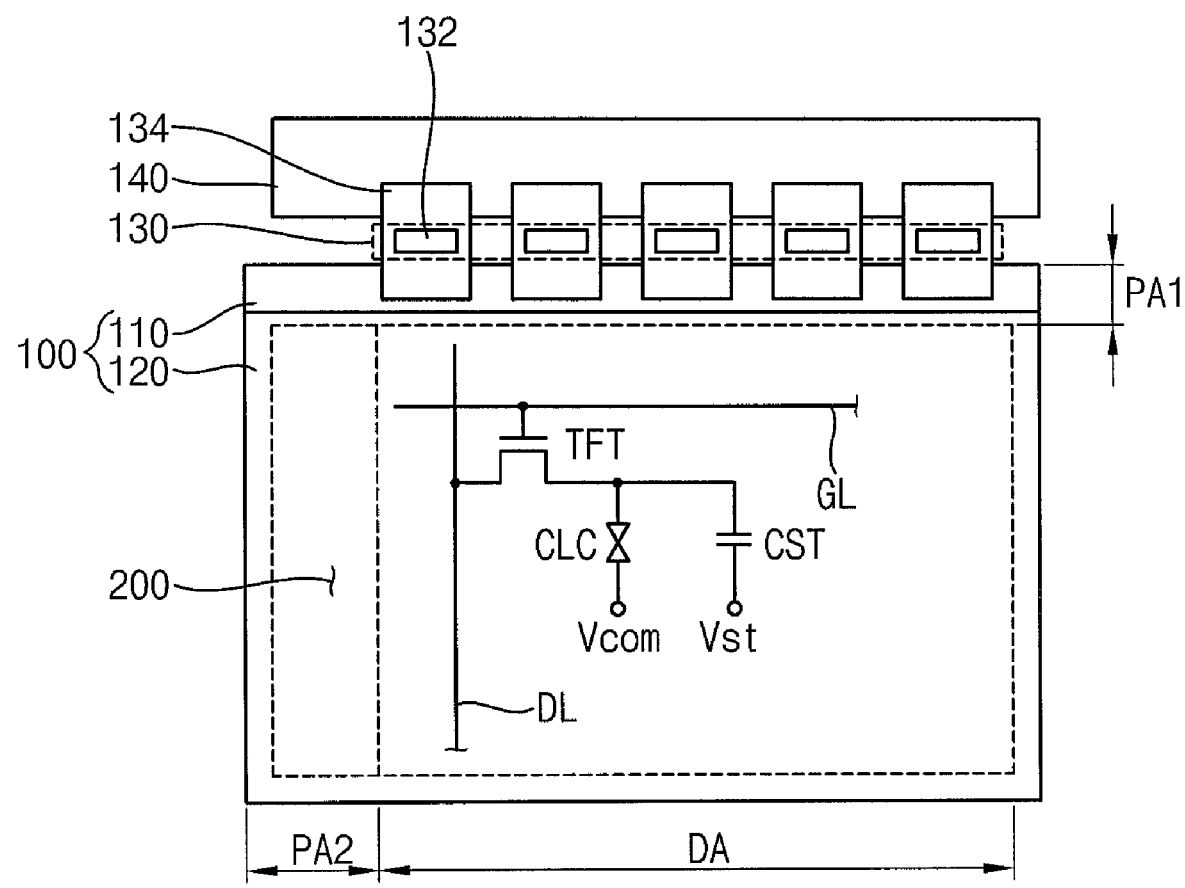
FIG. 1 is a plane view of a display apparatus according to an embodiment of the present invention.

Some embodiments of the invention are described below with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions are not intended to represent actual dimensions.

It will be understood that when an element or layer is referred to as being "on," "connected to" or "coupled to" another element or layer, it can be directly on, directly connected, or directly coupled to the other element or layer, or alternative intervening elements or layers may be present. In contrast, when an element is referred to as being "directly on," "directly connected to" or "directly coupled to" another element or layer, there are no intervening elements or layers present. Like reference numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element, component, region, layer or section discussed below could alternatively be termed a "second" element, component, region, layer or section without departing from the teachings of the present invention.

Spatially relative terms, such as "beneath," "below," "lower," "above," "upper" and the like, may be used herein for ease of description to describe one feature's relationship to another feature(s). It will be understood that the spatially relative terms are not intended to limit the invention to a particular spatial orientation of a device in use or operation. For example, if the device depicted in the figures is turned over, elements described as "below" or "beneath" other elements would then be oriented "above" the other elements. Thus, the term "below" is not intended to exclude such orientation. The device may be otherwise oriented (rotated 90 degrees or by some other angle).

The terminology used herein is for the purpose of describing particular embodiments only and is not intended to limit the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes illustrated herein but are to include deviations that result, for example, from manufacturing variations. For example, an implanted region illustrated as a rectangle will typically have rounded or curved features and/or gradients of implant concentration at the edges rather than perfectly straight edges or an abrupt boundary at implanted/non-implanted regions. Likewise, an additional doped region may be formed in an ion implantation between the intended implanted region and the surface through which the implantation takes place. Thus, the regions illustrated in the figures are schematic in nature and their shapes are not intended to illustrate the actual shapes or to limit the scope of the invention.

Now the present invention will be explained in detail with reference to the accompanying drawings.

FIG. 1 is a plane view illustrating a display apparatus according to an embodiment of the present invention. The display apparatus includes a display panel 100, a gate driving circuit 200 for driving the display panel 100, and a data driving circuit 130.

The display panel 100 includes an array substrate, a counter substrate (such as a color filter substrate, for example) separated from the array substrate by a predetermined distance and facing the array substrate, and a liquid crystal layer disposed between the array substrate and the counter substrate. The display panel 100 includes a display area DA and a peripheral area PA surrounding the display area DA. The display area DA includes gate lines GL running in a first direction, data lines DL running in a second direction transverse to the first direction, and a plurality of pixel areas defined by the gate lines GL and the data lines DL, for displaying an image.

A thin-film transistor (TFT) serving as a switching element, a liquid crystal capacitor CLC electrically connected to the TFT, and a storage capacitor CST are formed in each pixel area. The gate electrode of the TFT is electrically connected to the gate line GL, the source electrode of the TFT is electrically connected to the data line DL, and the drain electrode of the TFT is electrically connected to the liquid crystal capacitor CLC and the storage capacitor CST.

The peripheral area PA includes a first peripheral area PA1 at one end of the data lines DL, and a second peripheral area PA2 at one end of the gate lines GL.

The data driving circuit 130 includes one or more data driving chips 132, for outputting data signals to the data lines DL synchronously with gate signals applied to the gate lines GL. Each data driving chip 132 is mounted on a flexible printed circuit board (FPCB) 134. The FPCB 134 has one side attached to a PCB 140, and the FPCB 134 is electrically connected to the PCB 140. The data driving chip 132 is electrically connected to the PCB 140 and the display panel 100 through the FPCB 134.

The gate driving circuit 200 includes a shift register having a plurality of stages cascade-connected together, for sequentially providing the gate-on signals on the gate lines GL. The gate driving circuit 200 is integrated as an integrated circuit on the second peripheral area PA2 of the display panel 100. The integrated gate driving circuit 200 may be manufactured from any one or more of different materials, including for example low-resistance metal layers such as a triple layer of molybdenum/aluminum/molybdenum (Mo/Al/Mo) used to enhance the driving margin.

Figure 2:
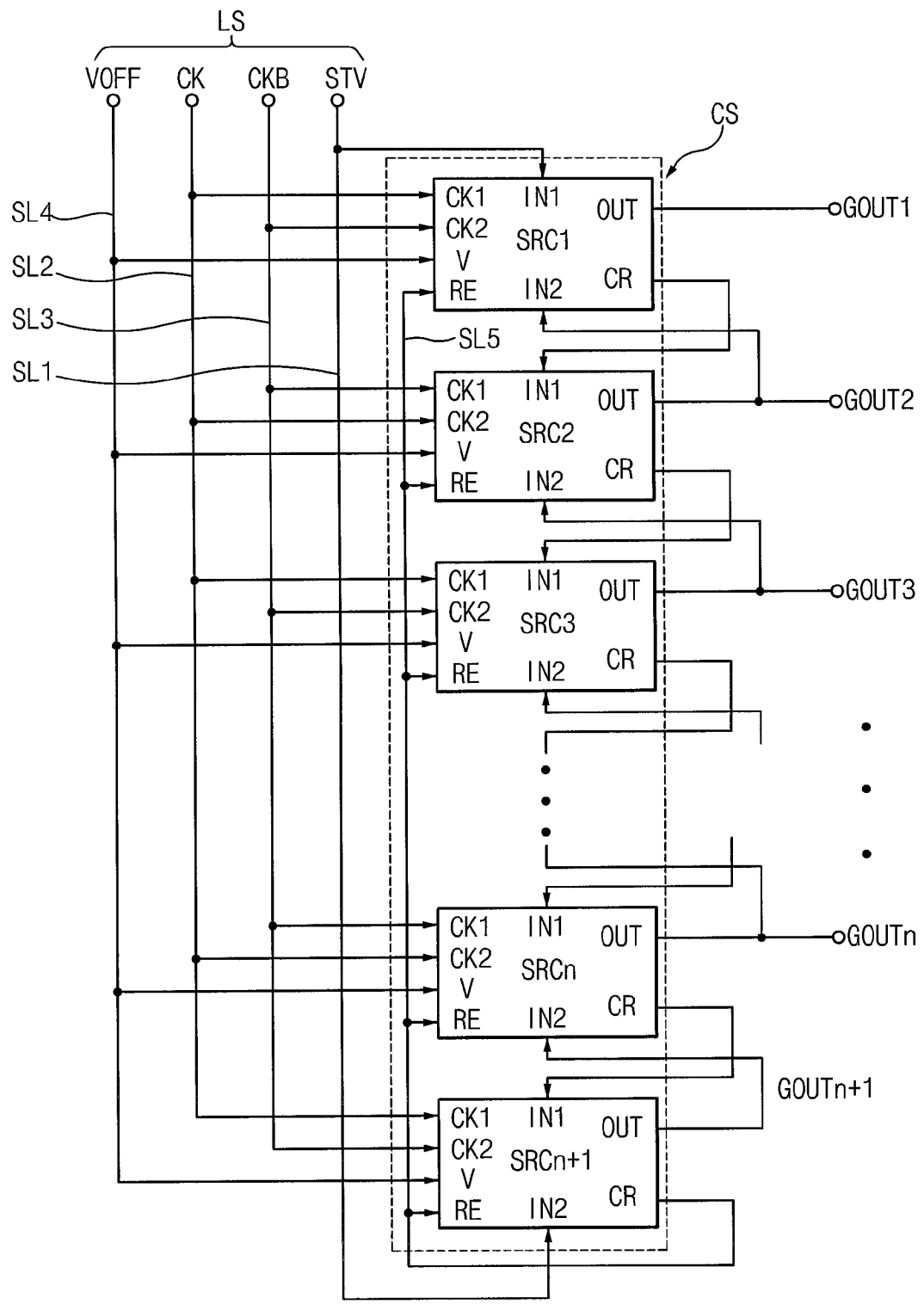
FIG. 2 is a block diagram illustrating a gate driving circuit of FIG. 1 according to a first example.

FIG. 2 is a block diagram of a gate driving circuit of FIG. 1 according to a first example. This gate driving circuit includes a circuit section CS and a line section LS. The circuit section CS includes first to (n+1)-th stages SRC1 to SRC(n+1) that are cascade-connected to each other, for outputting gate signals GOUT on their respective output terminals OUT, with the gate signals GOUT being sequentially driven at the gate-on voltage level. The line section LS provides control signals to the circuit section CS.

The first to n-th stages SRC1 to SRCn are driving stages, and the (n+1)-th stage SCR(n+1) is a dummy stage. Each of the first to (n+1)-th stages SRC1 to SRC(n+1) includes a first clock terminal CK1, a second clock terminal CK2, a first input terminal IN1, a second input terminal IN2, a voltage terminal V, a reset terminal RE, a carry terminal CR and an output terminal OUT.

The first clock terminal CK1 of each of the stages SRC (i.e., each of stages SRC1 to SRC(n+1)) receives a clock signal opposite in phase to a clock signal on the stage's second clock terminal CK2. More particularly, odd-numbered stages SRC1, SRC3, etc. receive a first clock signal CK at their first clock terminals CK1, and receive a second clock signal CKB opposite in phase to the first clock signal CK at their second clock terminals CK2. Even-numbered stages SRC2, SRC4, etc. receive the second clock signal CKB at their first clock terminals CK1, and receive the first clock signal CK opposite in phase to the second clock signal CKB at their second clock terminals CK2.

The first input terminal IN1 of each stage SRC receives either a vertical start signal STV or the carry signal CR of the previous stage. For example, the first input terminal IN1 of the first stage SRC1 receives the vertical start signal, and the first input terminal IN1 of each of the stages SRC2 to SRC(n+1) receives the carry signal of the respective previous stage of the stages SRC1 to SRCn.

The second input terminal IN2 of each stage SRC receives either the gate signal GOUT of the next stage or the vertical start signal STV. For example, the second input terminals IN2 of the first to n-th stages SRC1 to SRCn receive the gate signals GOUT of the respective next stages SRC2 to SRC(n+1), and the second input terminal IN2 of the final stage SRC(n+1) receives the vertical start signal STV.

An off-voltage is provided to the voltage terminal V of each of the stages. In some embodiments, the off-voltage is about −5 V to −7 V.

The carry signal of the final stage SRC(n+1) is provided to the reset terminal RE of each of the stages.

In each SRC stage, when the first clock terminal CK1 is high, the high level signal on the first clock terminal CK1 may be provided to the output terminal OUT of the SRC stage. In particular, in some embodiments, when the first clock signal CK is high, the high level of the first clock signal CK is provided to the output terminal OUT of one of the odd-numbered stages SRC1, SRC3, . . . , with the consecutive odd-numbered stages providing the high level of the first clock signal CK in respective consecutive periods of the first clock signal CK. When the second clock signal CKB is high, the high level of the second clock signal CKB is provided to the output terminal OUT of one of the even-numbered stages SRC2, SRC4, . . . , with the consecutive even-numbered stages providing the high level of the second clock signal CKB in respective consecutive periods of the second clock signal CKB. In this way, the first to (n+1)-th stages SRC1 to SRC(n+1) sequentially drive their gate signals GOUT to the gate-on voltage level.

The line section LS is formed at one side of the circuit section CS, and includes a plurality of lines for providing signals CK, CKB, STV and the off-voltage VOFF to the first to (n+1)-th stages. More particularly, the line section LS includes a start signal line SL1 for the vertical start signal STV, a first clock line SL2 for the first clock signal CK, a second clock line SL3 for the second clock signal CKB, a voltage line SL4 for the off-voltage VOFF, and a reset line SL5. The vertical start signal STV is provided to the start signal line SL1 from outside, and the start signal line SL1 provides the vertical start signal STV to the first input terminal IN1 of the first stage and the second input terminal IN2 of the final stage. In other words, the start signal line SL1 provides the vertical start signal STV to the first input terminal IN1 of the first stage SRC1 and the second input terminal IN2 of the (n+1)-th stage SRC(n+1).

The first clock signal CK is provided to the first clock line SL2 from outside, and the first clock line SL2 provides the first clock signal CK to the first clock terminals CK1 of the odd-numbered stages SRC1, SRC3, ... and the second clock terminals CK2 of the even-numbered stages SRC2, SRC4, ....

The second clock signal CKB opposite in phase to the first clock signal CK is provided to the second clock line SL3 from outside, and the second clock line SL3 provides the second clock signal CKB to the second clock terminals CK2 of the odd-numbered stages SRC1, SRC3, ... and the first clock terminals CK1 of the even-numbered stages SRC2, SRC4, ....

The off-voltage Voff is provided to the voltage line SL4, and the voltage line SL4 provides the off-voltage Voff to the voltage terminals V of the first to (n+1)-th stages SRC1 to SRC(n+1). The carry signal CR of the final stage SRC(n+1) is provided to the reset line SL5, and the reset line SL5 provides the carry signal to the reset terminals RE of the first to (n+1)-th stages SRC1 to SRC(n+1).

As mentioned above, each stage SRCm (m>1) receives, at the first input terminal IN1, the carry signal of the (m−1)-th stage SRC(m−1) as the first input signal, and each stage SRCm (m<n+1) receives at the second input terminal IN2, the gate signal GOUT(m+1) of the (m+1)-th stage SRC(m+1) as the second input signal. In other embodiments, however, a stage SRCm receives, at the first input terminal IN1, the carry signal of stage (m−2), (m−3), (m−4), or some other preceding stage, and/or receives the gate signal GOUT of stage (m+2), (m+3), (m+4), or some other subsequent stage.

Figure 3:
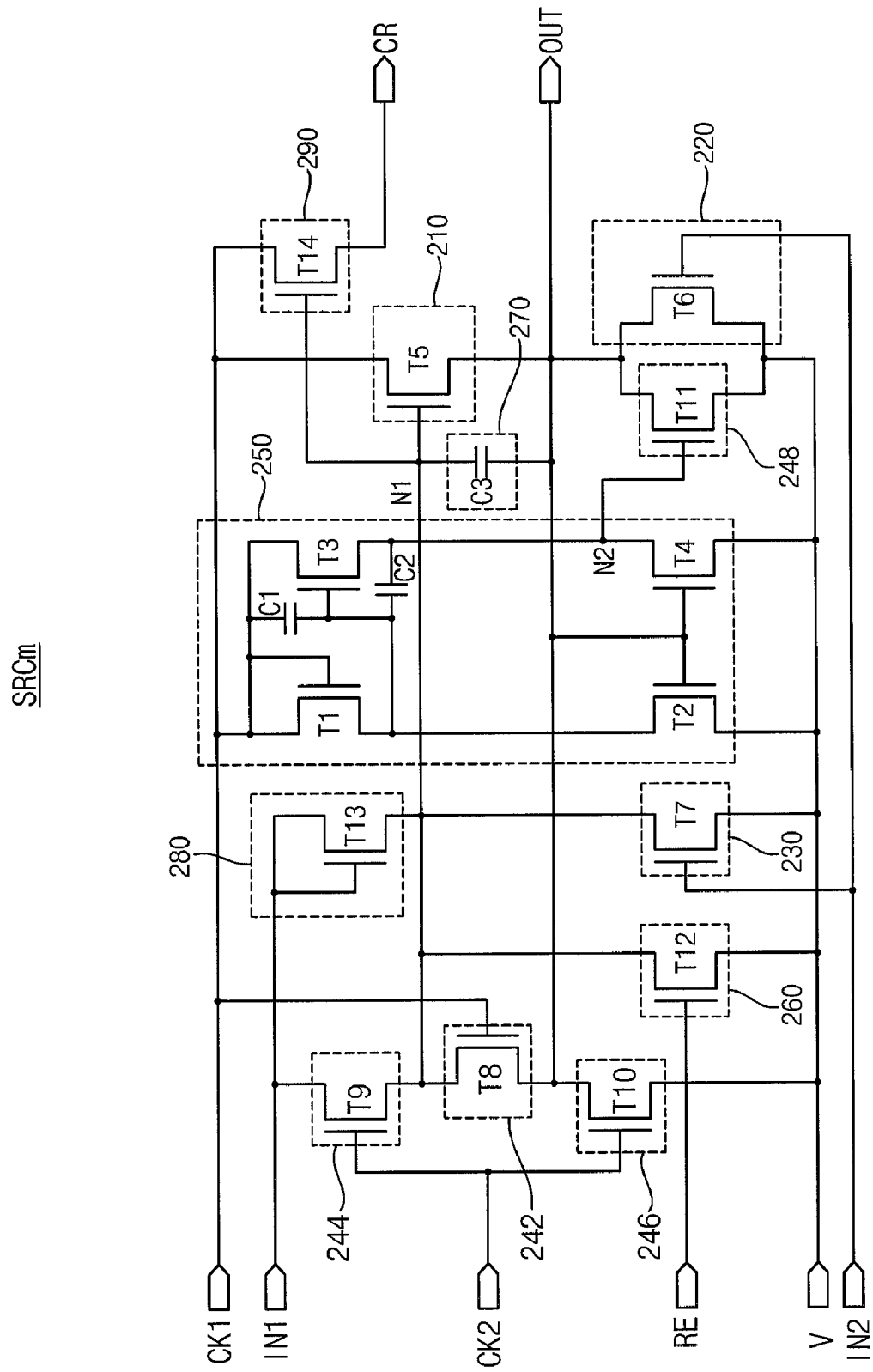
FIG. 3 is a schematic circuit diagram illustrating a stage of FIG. 2.
Figure 4:
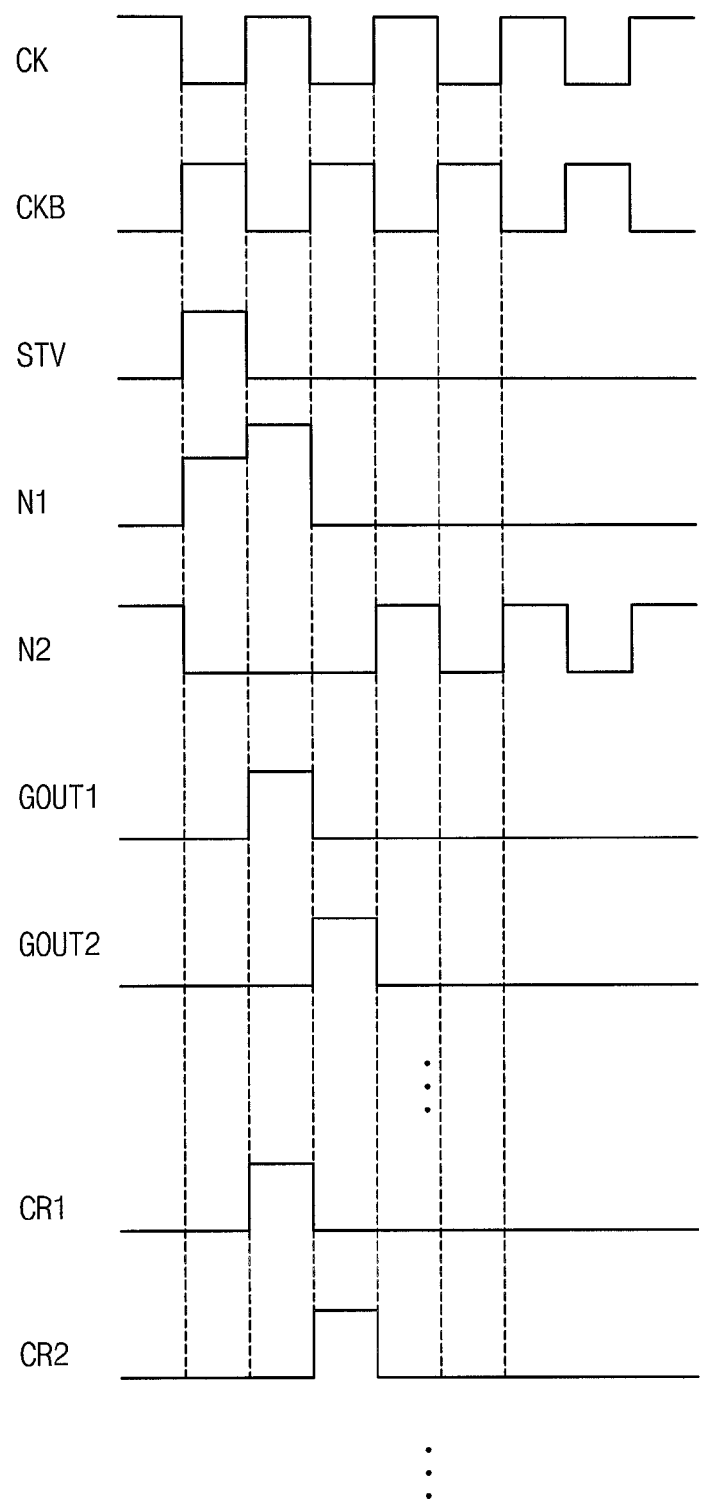
FIG. 4 is a timing diagram of signals of the stage of FIG. 3.

FIG. 3 is a schematic circuit diagram illustrating a stage in FIG. 2, and FIG. 4 is a timing diagram of signals of the stage in FIG. 3.

Referring to FIGS. 3 and 4, in the gate driving circuit 200 according to the present example, the m-th stage SRCm includes a pull-up section 210 and a pull-down section 220. The pull-up section 210 pulls up the m-th gate signal GOUTm to the voltage of the first clock terminal CK1 in response to the carry signal of the (m−1)-th stage SRC(m−1). After the signal GOUTm was thus pulled up, the pull-down section 220 pulls down the m-th gate signal GOUTm to the off-voltage Voff in response to the gate signal GOUT(m+1) of the (m+1)-th stage.

The pull-up section 210 includes a fifth transistor T5 having a gate electrode connected to a first node N1, a drain electrode connected to the first clock terminal CK1, and a source electrode connected to the output terminal OUT. Therefore, the drain electrode of the fifth transistor T5 receives the first clock signal CK or the second clock signal CKB through the first clock terminal CK1.

The pull-down section 220 includes a sixth transistor T6 having a gate electrode connected to a second node N2, a drain electrode connected to the output terminal OUT, and a source electrode connected to the voltage terminal V. The off-voltage is provided to the source electrode of the sixth transistor T6.

The m-th stage further includes a pull-up driving circuit. The pull-up driving circuit turns on the pull-up section 210 in response to the carry signal of the (m−1)-th stage SRC(m−1), and turns off the pull-up section 210 in response to the gate signal GOUT(m+1) of the (m+1)-th stage SRC(m+1). The pull-up driving circuit includes a buffer section 280, a charging section 270 and a discharging section 230.

The buffer section 280 includes a thirteenth transistor T13 having a gate electrode connected to the first input terminal IN1, a drain electrode connected to the first input terminal IN1, and a source electrode connected to the first node N1. The charging section 270 includes a third capacitor C3 having a first electrode connected to the first node N1 and a second electrode connected to the output terminal OUT. The discharging section 230 includes a seventh transistor T7 having a gate electrode connected to the second input terminal IN2, a drain electrode connected to the first node N1, and a source electrode connected to the voltage terminal V. The off-voltage Voff is provided to the source electrode of the seventh transistor T7.

In this pull-up driving circuit, when the thirteenth transistor T13 is turned on in response to the (m−1)-th stage, the carry signal of the (m−1)-th stage SRC(m−1) is applied to the first node N1 to drive the first node N1 to a high voltage, and the carry signal of the (m−1)-th stage charges the third capacitor C3. When the third capacitor C3 is charged to at least the threshold voltage of the fifth transistor T5 and the first clock terminal CK1 becomes high, the fifth transistor T5 turns on to transfer the high voltage at the first clock terminal CK1 to the output terminal OUT.

In this example, when the fifth transistor T5 turns on, the fifth transistor T5 outputs the gate-on signal on the output terminal OUT of the m-th stage SRCm. Then, when the seventh transistor T7 is turned on in response to the (m+1)-th gate signal GOUT(m+1), the third capacitor C3 is discharged to the off-voltage Voff of the voltage terminal V, so that the fifth transistor T5 is turned off.

The m-th stage SRCm further includes a first holding section 242 and a second holding section 244 maintaining the first node N1 at the off-voltage Voff.

The first holding section 242 includes an eighth transistor T8 having a gate electrode connected to the first clock terminal CK1, a drain electrode connected to the first node N1, and a source electrode connected to the output terminal OUT. The second holding section 244 includes a ninth transistor T9 having a gate electrode connected to the second clock terminal CK2, a drain electrode connected to the first input terminal IN1, and a source electrode connected to the first node N1.

The first and second holding sections 242 and 244 maintain the first node N1 at the off-voltage Voff after the m-th gate signal GOUTm is discharged to the off-voltage Voff by the pull-down section 220. In particular, when the m-th gate signal GOUTm has been discharged to the off-voltage Voff and the eighth transistor T8 turns on in response to the clock signal on the first clock terminal CK1, the Voff voltage of the m-th gate signal GOUTm is applied to the first node N1 to maintain the first node N1 at the off-voltage Voff. In addition, when the ninth transistor T9 is turned on in response to the clock signal on the second clock terminal CK2 opposite in phase to the signal on the first clock terminal CK1, the first input signal, at the off-voltage Voff, is applied to the first node N1, to maintain the first node N1 at the off-voltage Voff.

Therefore, each of the first and second holding sections 242 and 244 are sequentially turned on in response to the signals on the respective first and second clock terminals CK1 and CK2, to maintain the first node N1 at the off-voltage Voff.

The m-th stage SRCm further includes a third holding section 246, a fourth holding section 248, and a switching section 250. The third and fourth holding sections 246 and 248 maintain the m-th gate signal GOUTm at the off-voltage Voff. The switching section 250 controls on/off switching of the fourth holding section 248.

The third holding section 246 includes a tenth transistor T10 having a gate electrode connected to the second clock terminal CK2, a drain electrode connected to the output terminal OUT, and a source electrode connected to the voltage terminal V. The source electrode of the tenth transistor T10 receives the off-voltage Voff. The fourth holding section 248 includes an eleventh transistor T11 having a gate electrode connected to the second node N2 of the switching section 250, a drain electrode connected to the output terminal OUT, and a source electrode connected to the voltage terminal V. The source electrode of the eleventh transistor T11 receives the off-voltage Voff.

The switching section 250 includes first, second, third and fourth transistors T1, T2, T3 and T4, and first and second capacitors C1 and C2.

The first transistor T1 has a gate electrode connected to the first clock terminal CK1, a drain electrode connected to the first clock terminal CK1, and a source electrode connected to a drain electrode of the second transistor T2. The gate and drain electrodes receive the signal on the first clock terminal CK1. The second transistor T2 has a gate electrode connected to the output terminal OUT, and a source electrode connected to the voltage terminal V to receive the off-voltage Voff. The third transistor T3 has a drain electrode connected to the first clock terminal CK1, a gate electrode connected to the first clock terminal CK1 through the capacitor C1, and a source electrode connected to the second node N2. Therefore, the drain and gate electrodes of the third transistor T3 receive the signal on the first clock terminal CK1. The second capacitor C2 is connected between the gate and source electrodes of the third transistor T3. The fourth transistor T4 has a gate electrode connected to the output terminal OUT, a drain electrode connected to the second node N2, and a source electrode connected to the voltage terminal V to receive the off-voltage Voff.

When the first and third transistors T1 and T3 are turned on by the signal on the first clock terminal CK1 and the signal on the first clock terminal CK1 is passed to the output terminal OUT, the output terminal OUT is pulled up to a high voltage. Consequently, the second and fourth transistors T2 and T4 are turned on, and the current provided by the first and third transistors T1 and T3 is discharged through the second and fourth transistors T2 and T4. Therefore, the second node N2 is maintained at a low voltage, so that the eleventh transistor T11 is off.

Then, when the m-th gate signal GOUTm is discharged to the off-voltage Voff in response to the (m+1)-th gate signal GOUT(m+1), the voltage on the output terminal OUT gradually decreases to the low level. Therefore, the second and fourth transistors T2 and T4 turn off, and the second node N2 is pulled up to the high level by the first and third transistors T1 and T3. Consequently, the eleventh transistor T11 turns on to rapidly discharge the output terminal OUT to the off-voltage Voff.

Then, when the first clock terminal CK1 becomes low voltage, the second node N2 also becomes low voltage, so that the eleventh transistor T11 is turned on. However, the tenth transistor T10 is turned on by the voltage on the second clock terminal CK2, which voltage is opposite in phase to the voltage on the first clock terminal CK1, so that the output terminal OUT is discharged to the off-voltage Voff.

Each of the third and fourth holding sections 246 and 248 sequentially discharges the output terminal OUT to the off-voltage Voff in response the signals on the respective second and first clock terminals CK2 and CK1.

The m-th stage of the gate driving circuit 200 further includes a reset section 260 and a carry section 290.

The reset section 260 includes a twelfth transistor T12 having a gate electrode connected to the reset terminal RE, a drain electrode connected to the first node N1, and a source electrode connected to the voltage terminal V to receive the off-voltage Voff. When the carry signal of the final stage SRC(n+1) is provided to the reset terminal RE, the twelfth transistor T12 is turned on, so that the first node N1 is discharged to the off-voltage Voff. Therefore, the m-th gate signal GOUTm is discharged to the off-voltage Voff by the carry signal of the (n+1)-th stage SRC(n+1).

The carry section 290 includes a fourteenth transistor T14 having a gate electrode connected to the first node N1, a drain electrode connected to the first clock terminal CK1 (to receive the first clock signal CK for example), and a source electrode connected to the carry terminal CR. The carry section 290 passes the high level of the first clock signal CK to the carry terminal CR when the voltage on the first node N1 becomes high.

In the gate driving circuit according to the present embodiment, the m-stage's first and second holding sections have different electrical characteristics. For example, in some implementations the width-to-length ratio (W/L) of the ninth transistor is larger than the width-to-length ratio (W/L) of the eighth transistor to reduce the ripple at the first node N1.

Now the ripple reduction at the first node will be explained in detail with reference to the accompanying drawings.

Figure 5:
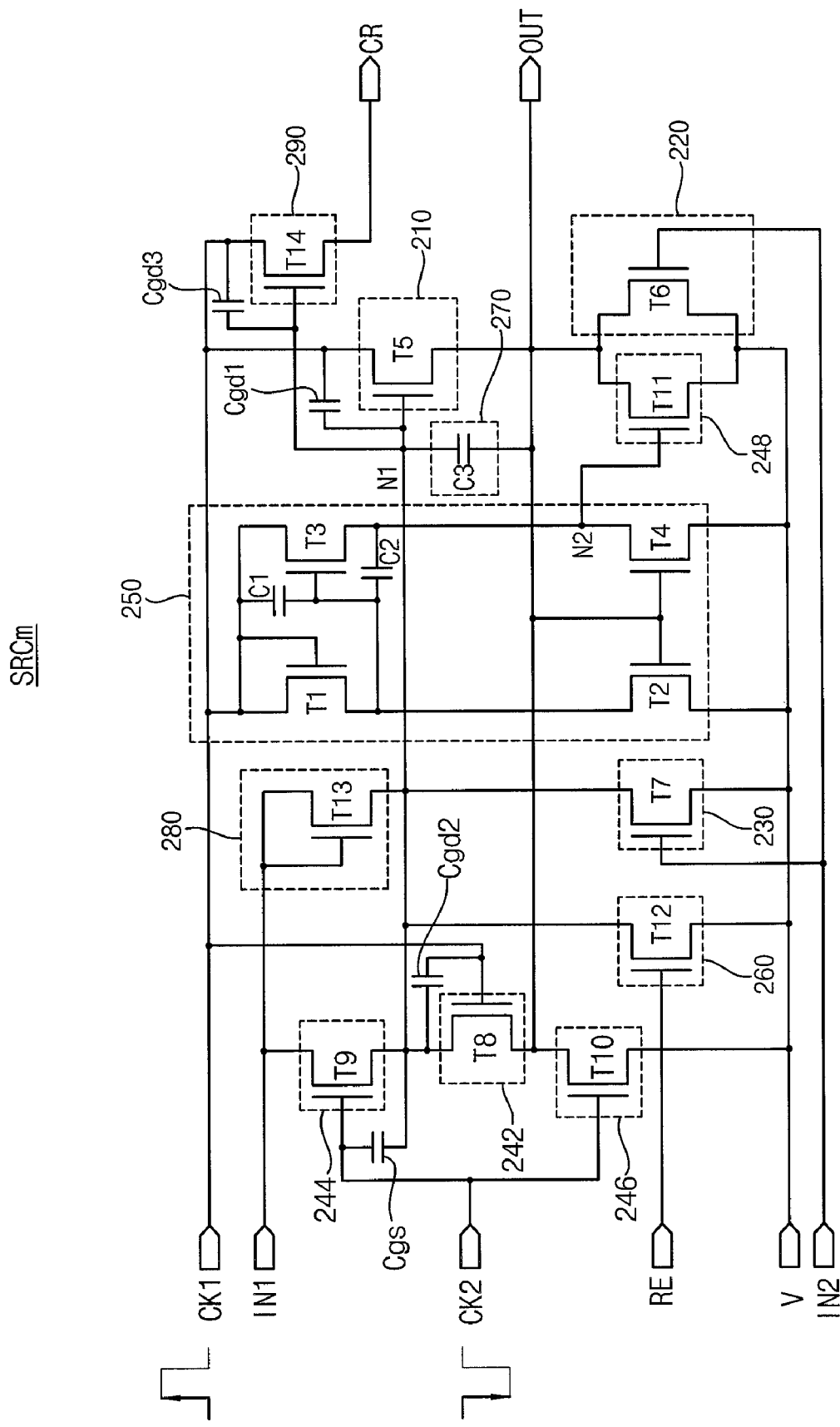
FIG. 5 is a schematic circuit diagram explaining reduction of a voltage ripple at a node of FIG. 3.

FIG. 5 is a schematic circuit diagram illustrating the ripple improvement at the first node according to some embodiments of the present invention.

Referring to FIG. 5, a ripple occurs at the first node N1 connected to the control electrode of the pull-up section 210 since the first node N1 is coupled to the first clock terminal CK1 by first, second and third parasitic capacitances Cgd1, Cgd2 and Cgd3 of the pull-up section 210, the first holding section 242 and the carry section 290. More particularly, the ripple is caused by the first clock terminal CK1 being coupled to (a) the first parasitic capacitance Cgd1 between the drain and gate electrodes of the fifth transistor T5, (b) the second parasitic capacitance Cgd2 between the drain and gate electrodes of the eighth transistor T8, and (c) the third parasitic capacitance Cgd3 between the drain and gate electrodes of the fourteenth transistor T14.

The ripple may turn on the fifth transistor T5 when the transistor is supposed to be off, so that an abnormal gate-on signal occurs on the output terminal OUT to cause a driving defect. For example, assuming that the first clock terminal CK1 receives the first clock signal CK, a rising edge of the first clock signal CK may raise the voltage on the first node N1 to produce an abnormal gate-on signal, so that a driving defect occurs.

In addition, a ripple may be caused at the first node N1 by parasitic capacitance Cgs of the second holding section 244. This capacitance Cgs couples the first node N1 to the second clock terminal CK2. The parasitic capacitance Cgs is the capacitance between the gate and source electrodes of the ninth transistor T9. In this case, since the signal on the second clock terminal CK2 has the opposite phase relative to the signal on the first clock terminal CK1, the ripple caused by the parasitic capacitive coupling with the second clock terminal CK2 ("reverse ripple") has the opposite phase relative to the ripple caused by the parasitic capacitive coupling with the first clock terminal CK1. As a result, the reverse ripple, caused by the parasitic capacitive coupling with the second clock terminal CK2, compensates the ripple caused by the parasitic capacitive coupling with the first clock terminal CK1, to reduce the total ripple at the first node N1. In some embodiments, the total ripple may be decreased by as much as the difference between the ripple caused by the parasitic capacitances Cgd1, Cgd2 and Cgd3 of the fifth, eighth and fourteenth transistors T5, T8 and T14, and the ripple caused by the parasitic capacitance Cgs of the ninth transistor T9, to decrease the total ripple at the first node N1.

Therefore, if the ninth transistor T9 has a large width-to-length ratio (W/L) to increase the parasitic capacitance Cgs, the reverse ripple is increased to reduce the total ripple at the first node N1.

Figure 6:
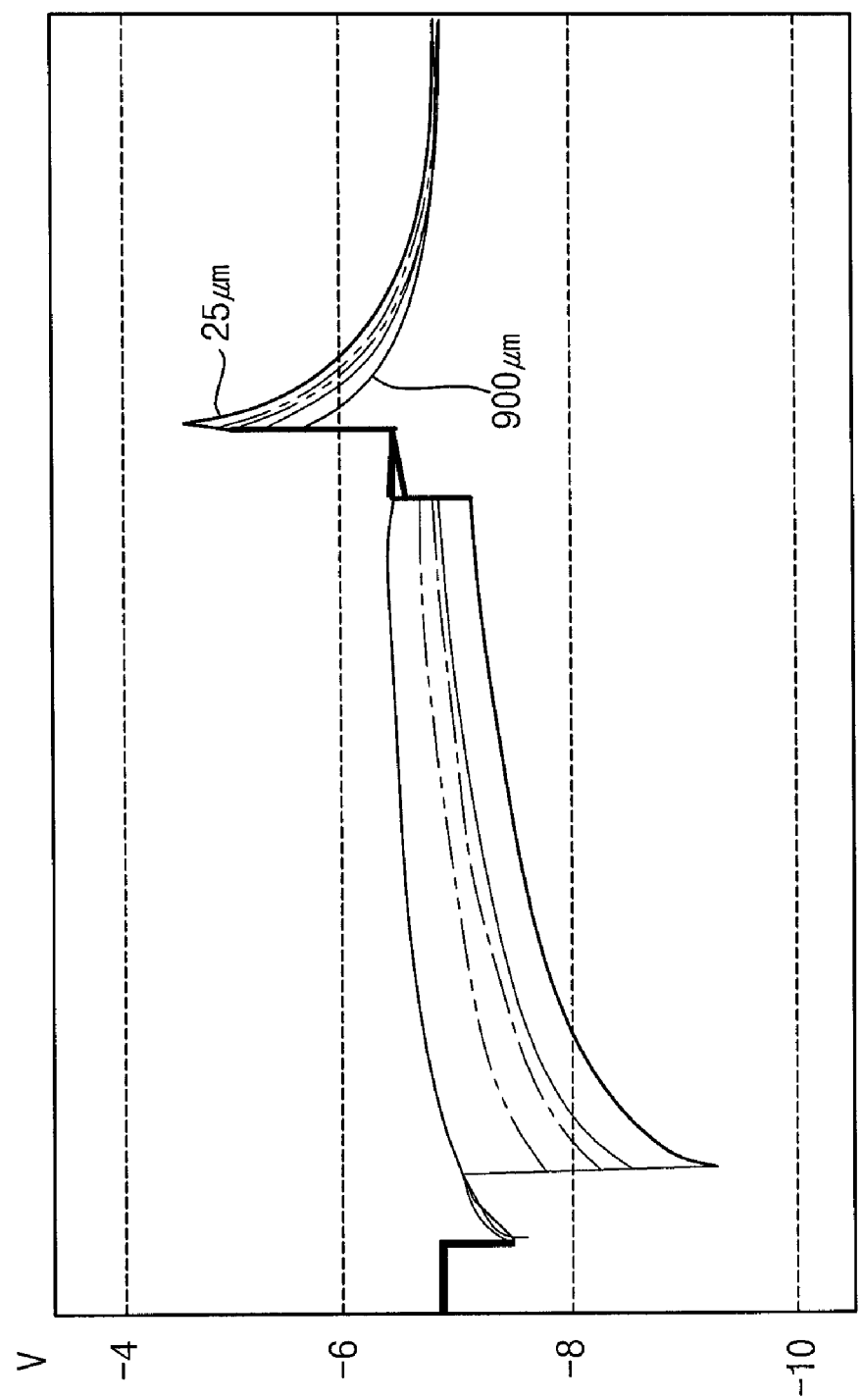
FIG. 6 is a timing diagram illustrating simulated voltage ripples of FIG. 5.

FIG. 6 is a waveform diagram illustrating a simulated ripple at the first node N1 of FIG. 5.

In the example of FIG. 6, the first node N1 is supposed to be at an off-voltage of −7 V during "gate-off" time, i.e., when the gate signal GOUT is at the gate-off voltage. However, the first node N1 may be raised to a higher voltage due to a ripple caused by the parasitic capacitances between the first node N1 and the clock terminals. The ripple is smaller however if the ninth transistor T9 has the channel width of 900 μm compared to the channel width of 25 μm (the channel length is assumed the same for both cases).

Table 1 shows simulated values for the ripple at the first node N1 for different width-to-length ratios (W/L) of the ninth transistor T9. These values are also illustrated in FIG. 6. These values were obtained for the channel length L being constant as the channel width W assumed values of 25 μm, 354 μm, 500 μm and 900 μm. The results were obtained for a high temperature operation of the ninth transistor T9 both before and after degradation of the ninth transistor T9.

TABLE 1

| Von = 23 V, Voff = −7 V | Ripple at the first node (Vgs) | | | |
|---|---|---|---|---|
| Width of T9 [μm] | 25 | 354 | 500 | 900 |
| Driven at High Temperature | 2.53 | 2.21 | 2.05 | 1.61 |
| Driven at High Temperature after Degradation | 2.71 | 2.6 | 2.5 | 2.24 |

As shown in Table 1, in the high temperature operation before degradation for the 25 μm channel width of the ninth transistor T9, the ripple was about 2.53 V; for the 354 μm channel width, the ripple was about 2.21 V; for the 500 μm channel width, the ripple was about 2.05 V; and for the 900 μm channel width, the ripple was about 1.61 V. Thus, the ripple at the first node may be decreased by increasing the channel width of the ninth transistor T9.

In high temperature operation after degradation, for the 25 μm channel width of the ninth transistor T9, the ripple was about 2.71 V; for the 354 μm channel width of the ninth transistor T9, the ripple was about 2.6 V; for the 500 μm channel width, the ripple was about 2.5 V; and for the 900 μm channel width, the ripple was about 2.24 V. Thus, the ripple at the first node may be decreased in this case also by increasing the channel width of the ninth transistor T9.

The ninth transistor T9 performs the same function as the thirteenth transistor T13 when the third capacitor C3 is discharged. Therefore, if the width-to-length ratio (WIL) of the ninth transistor T9 is increased, the current-voltage (I-V) characteristics may be improved and the charging rate of the third capacitor C3 by the first input signal may be improved, so that a low temperature driving margin of the fifth transistor T5 may be enhanced.

Table 2 shows results obtained for the low temperature driving margin and a normal temperature frequency driving margin for different width-to-length ratios (W/L) of the ninth transistor T9. The results were obtained for the channel length of the ninth transistor T9 being constant as the channel width of the ninth transistor T9 assumed values of 25 μm and 936 μm.

TABLE 2

| Conditions | | Temperature at Driving Defect [° C.] | | Normal Temperature Frequency Driving Margin [Hz] | | Voltage [V] | |
|---|---|---|---|---|---|---|---|
| Width of T9 [μm] | Cgs:Cgd | Min. | Max. | Min. | Max. | dV | Voff |
| 25 | 10 | −33 | −18 | 115 | 121 | 38 | −7.4 |
| 936 | 11 | −50 | −24 | 124 | >130 | 34 to 38 | −7.4 |

As shown in Table 2, if the width-to-length ratio (W/L) of the ninth transistor T9 is increased, the ninth transistor T9 may operate at lower voltages (dV) and at lower temperatures (below −20° C.), and the normal temperature frequency driving margin increases beyond 124 Hz.

Therefore, in some embodiments of the gate driving circuit of the present invention, the ninth transistor T9 has a larger width-to-length ratio (W/L) than the eighth transistor T8. As a result, the reverse ripple increases to reduce the total ripple at the first node N1. In addition, when both the ninth transistor T9 and the thirteenth transistor T13 are on, the charging rate of the third capacitor C3 by the first input signal is improved, and hence the low temperature driving margin is enhanced.

However, if the width-to-length ratio (W/L) of the ninth transistor T9 is too large, the ninth transistor T9 will not operate properly due to a threshold voltage shift; the ninth transistor T9 will then merely function as the parasitic capacitance Cgs. This is termed "transistor degradation" herein. The fifth transistor T5 will not then be properly driven. Therefore, the width-to-length ratio (W/L) of the ninth transistor T9 should preferably be larger than that of the eighth transistor T8 but smaller than the sum of the width-to-length ratios (W/L) of the eighth transistor T8 and the fourteenth transistor T14.

Figure 7:
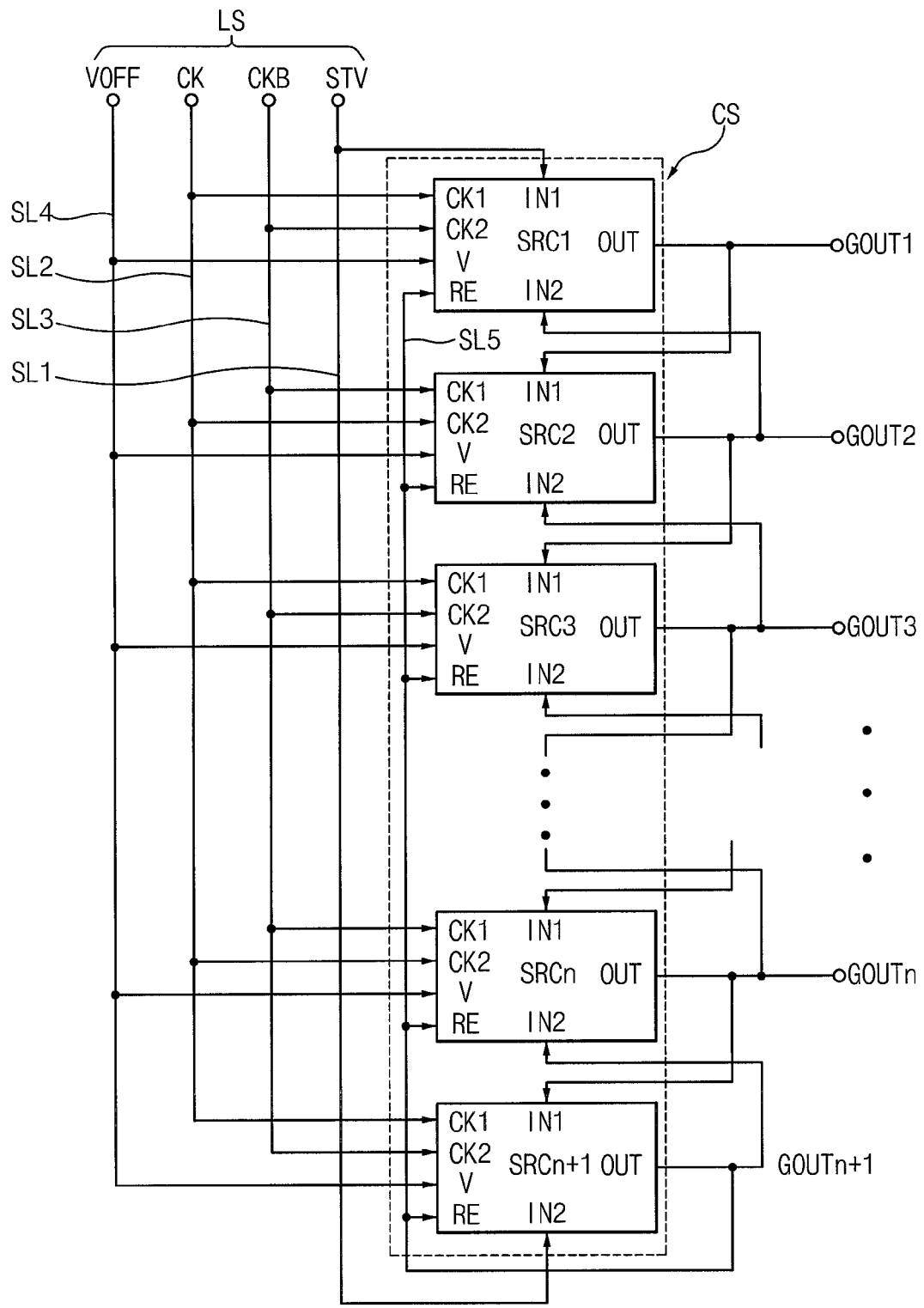
FIG. 7 is a block diagram illustrating a gate driving circuit of FIG. 1 according to a second example.

FIG. 7 is a detailed block diagram illustrating a gate driving circuit of FIG. 1 according to a second example. The gate driving circuit of this embodiment is similar to that of the first example. Thus, the same reference numerals will be used to refer to the same or like parts for the first and second example, and repetitive explanation of such parts will be avoided.

The gate driving circuit 200 of FIG. 7 includes a circuit section CS and a line section LS. The circuit section CS includes first to (n+1)-th stages SRC1 to SRC(n+1) that are cascade-connected to each other, for sequentially outputting the gate-on voltage as the gate signal GOUT. The line section LS provides various control signals to the circuit section CS.

Each of the first to (n+1)-th stages SRC1 to SRC(n+1) includes a first clock terminal CK1, a second clock terminal CK2, a first input terminal IN1, a second input terminal IN2, a voltage terminal V, a reset terminal RE and an output terminal OUT.

The first and second clock terminals CK1 and CK2 of each of the first to (n+1)-th stages SRC1 to SRC(n+1) receive clock signals of opposite phases.

A vertical start signal STV is provided to the first input terminal IN1 of the first stage SRC1. Gate signals GOUT1 to GOUTn of the respective first to n-th stages SRC1 to SRCn are provided to the first input terminals IN1 of the respective next stages SRC2 to SRC(n+1). The gate signals GOUT2 to GOUT(n+1) are provided to the second input terminals IN2 of the respective previous stages SRC1 to SRCn, and the vertical start signal STV is provided to the second input terminal IN2 of the (n+1)-th stage SRC(n+1).

The gate signal GOUT(n+1) of the (n+1)-th stage SRC(n+1) is provided to the reset terminals RE of the first to (n+1)-th stages SRC1 to SRC(n+1). An off-voltage Voff is provided to the voltage terminals V of the first to (n+1)-th stages SRC1 to SRC(n+1). Each SRC stage may pass the high level of the clock signal on the first clock terminal CK1 to the output terminal OUT.

The line section LS includes a start signal line SL1, a first clock signal line SL2, a second clock signal line SL3, a voltage line SL4 and a reset line SL5.

The vertical start signal STV is provided to the start signal line SL1 from outside, and the start signal line SL1 provides the vertical start signal STV to the first input terminal IN1 of the first stage SRC1 and the second input terminal IN2 of the (n+1)-th stage SRC(n+1).

The first clock signal line SL2 receives the first clock signal CK, and the second clock signal line SL3 receives the second clock signal CKB opposite in phase to the first clock signal CK. The first and second clock signal lines SL2 and SL3 provide the first and second clock signals CK and CKB to the first to (n+1)-th stages SRC1 to SRC(n+1).

The voltage line SL4 receives the off-voltage Voff, and provides the off-voltage Voff to the voltage terminals V of the first to (n+1)-th stages SRC1 to SRC(n+1).

The reset line SL5 receives the gate signal GOUT(n+1) of the final stage SRC(n+1), and provides the gate signal GOUT(n+1) to the reset terminals RE of the first to (n+1)-th stages SRC1 to SRC(n+1).

According to the present example, each m-th stage SRCm (m>1) of the gate driving circuit receives the gate signal GOUT(m−1) of the (m−1)-th stage SRC(m−1) as a start signal needed for the operation of the m-th stage SRCm.

Figure 8:
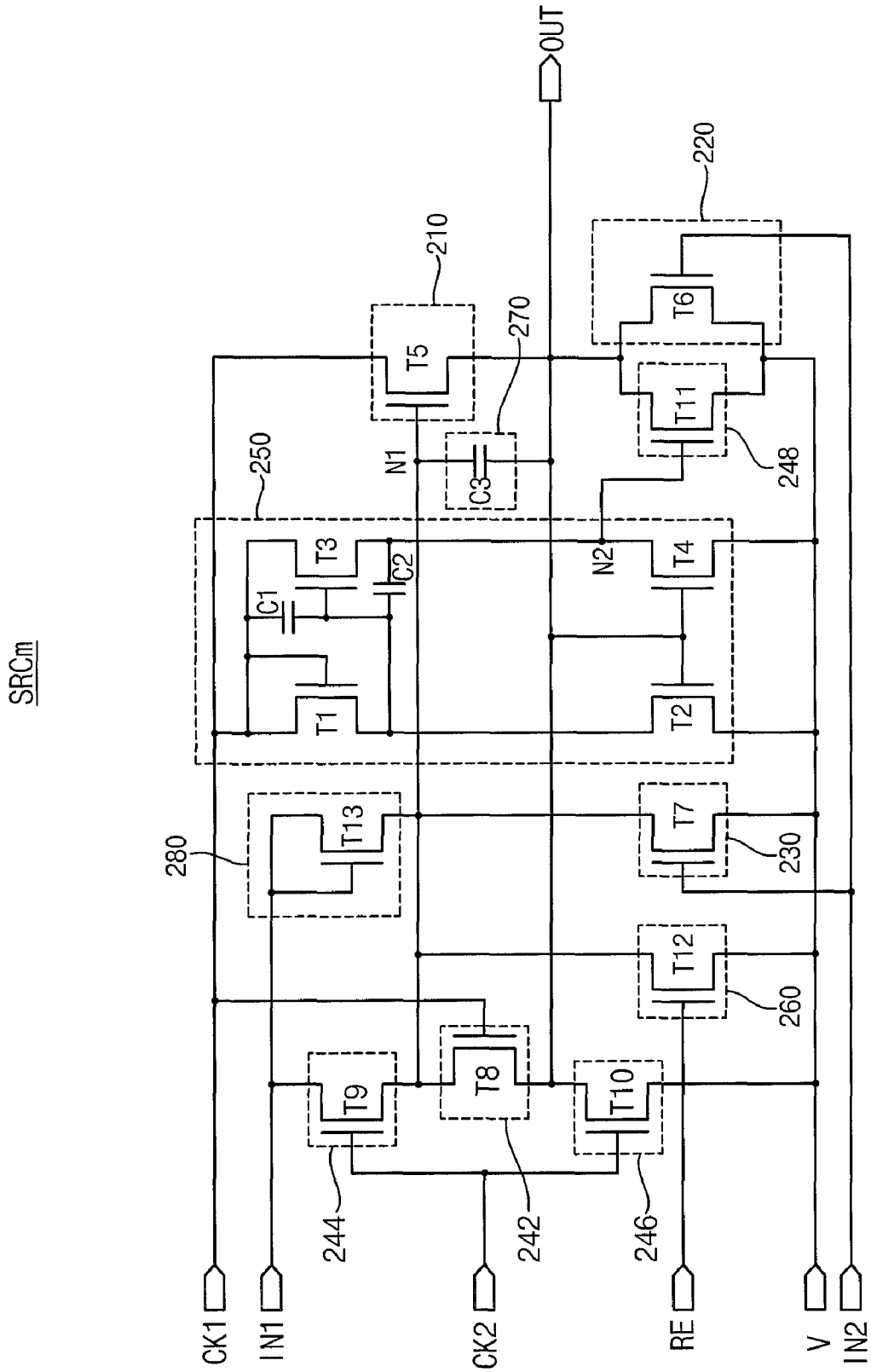
FIG. 8 is a schematic circuit diagram illustrating a stage of FIG. 7.

FIG. 8 is a schematic circuit diagram illustrating a single SRC stage of FIG. 7.

The SRC stage of the present example is similar to that of the first example. Thus, the same reference numerals will be used to refer to the same or like parts of the first and second examples, and repetitive explanation will be avoided.

Referring to FIG. 8, the stage SRCm ($1 \leq m \leq n+1$) includes a pull-up section 210 and a pull-down section 220. The pull-up section 210 pulls up the m-th gate signal GOUTm to the voltage of the first clock signal CK (assuming for the sake of illustration that the first clock terminal CK1 receives the first clock signal CK) in response to the (m−1)-th gate signal GOUT(m−1) if m>1. The pull-down section 220 pulls down the m-th gate signal GOUTm to the off-voltage Voff in response to the (m+1)-th gate signal GOUT(m+1) if m<n+1.

The m-th stage SRCm further includes a pull-up driving circuit. The pull-up driving circuit turns on the pull-up section 210 in response to the (m−1)-th gate signal GOUT(m−1), and turns off the pull-up section 210 in response to the (m+1)-th gate signal GOUT(m+1). The pull-up driving circuit includes a buffer section 280, a charging section 270 and a discharging section 230.

The m-th stage SRCm further includes a first holding section 242 and a second holding section 244. The first holding section 242 maintains the first node N1 at the off-voltage Voff in response to the first clock signal CK, and the second holding section 244 maintains the first node N1 at the off-voltage Voff in response to the second clock signal CKB. In addition, the m-th stage SRCm includes third and fourth holding sections 246 and 248 maintaining the m-th gate signal GOUTm at the off-voltage Voff, and a switching section 250 controlling on/off switching of the fourth holding section 248. In this example, the third holding section 246 controls the on/off switching in response to the second clock signal CKB, and the third and fourth holding sections 246 and 248 alternately discharge the output terminal OUT to the off-voltage Voff.

The m-th stage SRCm further comprises a reset section 260. The reset sections 260 of the first to (n+1)-th stages SRC1 to SRC(n+1) simultaneously discharge the respective first nodes N1 to the off-voltage Voff in response to the (n+1)-th gate signal GOUT(n+1).

In the m-th stage SRCm of the gate driving circuit according to the present example, the first holding section 242 and the second holding section 244 have different electrical characteristics. For example, the width-to-length ratio (W/L) of the ninth transistor may be made larger than the width-to-length ratio (W/L) of the eighth transistor.

Therefore, the reverse ripple at the first node N1, caused by coupling with the second clock signal CKB, increases relative to the ripple caused at the first node N1 by coupling with the first clock signal CK, and hence the driving defects are abated. In addition, since the ninth transistor T9 aids the thirteenth transistor T13 when the ninth transistor T9 charges the third capacitor C3, the charging rate of the third capacitor C3 is improved in accordance with the increased width-to-length ratio (W/L) of the ninth transistor T9, so that the low temperature driving margin is enhanced.

Figure 9:
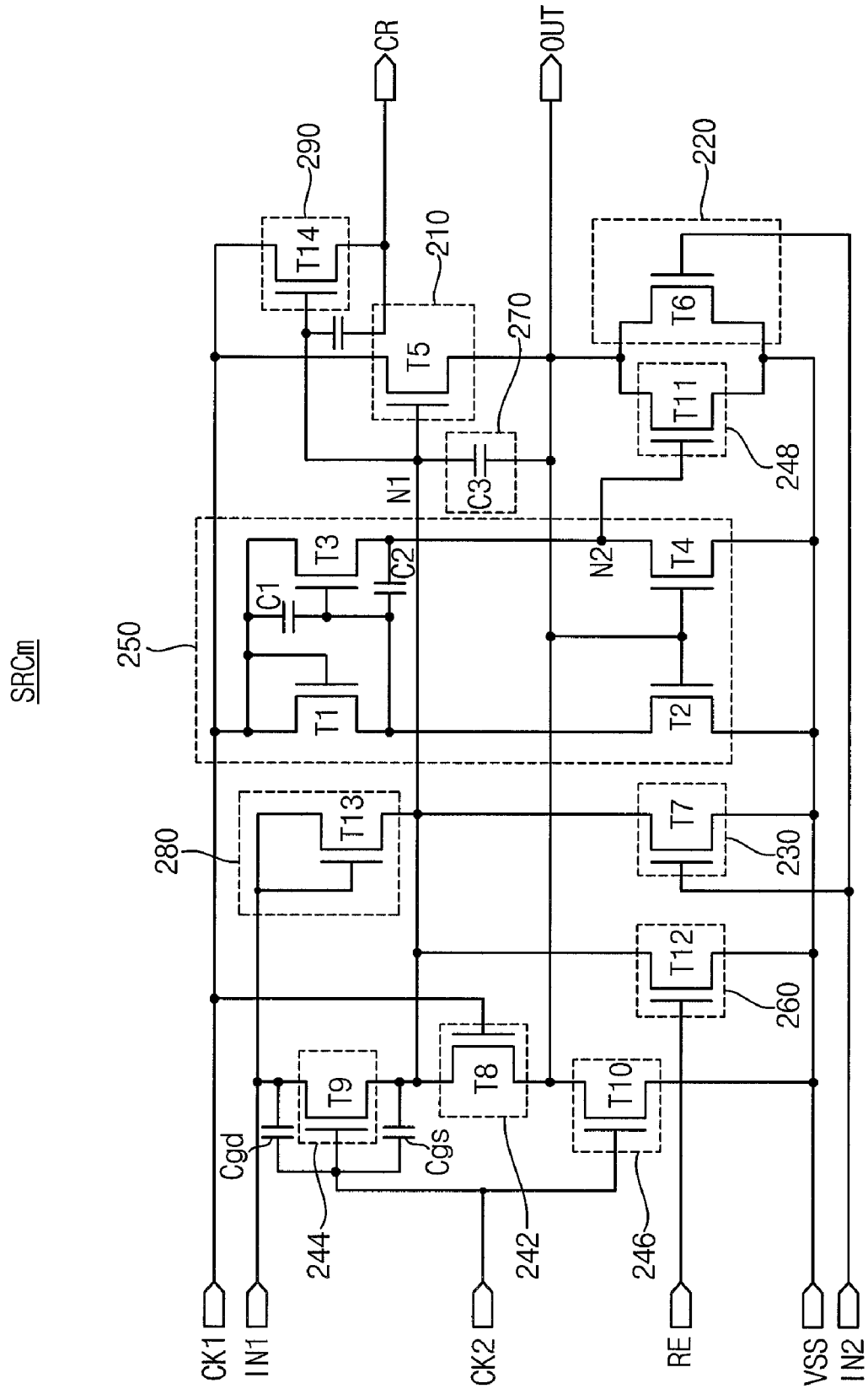
FIG. 9 is a schematic circuit diagram illustrating a stage of a gate driving circuit according to a third example.

FIG. 9 is a schematic circuit diagram illustrating a stage of a gate driving circuit according to a third example. The stage of the present embodiment is substantially the same as in FIG. 2 except for a ninth transistor and a thirteenth transistor. Thus, the same reference numerals will be used to refer to the same or like parts as those described in FIG. 2 and any repetitive explanation concerning the above elements will be omitted.

Referring to FIG. 9, a second holding section 244 includes a ninth transistor T9. The ninth transistor T9 includes a gate electrode electrically connected to a second clock terminal CK2, a drain electrode electrically connected to a first input terminal IN1, and a source electrode electrically connected to a first node N1.

The ninth transistor T9 has an asymmetric structure. In detail, a parasitic capacitance Cgs between the gate and source electrodes of the ninth transistor T9 is different from a parasitic capacitance Cgd between the gate and drain electrodes of the ninth transistor T9. In more detail, the parasitic capacitance Cgs is greater than the parasitic capacitance Cgd. When the second clock signal CKB is lowered from a high state to a low state, the parasitic capacitance Cgs that is greater than the parasitic capacitance Cgd reduces ripples of the first node N1 that is electrically connected to the source electrode of the ninth transistor T9. As the parasitic capacitance Cgs increases, a degree of a ripple reduction also increases. Regarding the relation between the parasitic capacitance Cgs and the ripple reduction will be explained in detail, referring to FIGS. 10A and 10B.

The m-th stage SRCm includes a pull-up driving circuit. The pull-up driving circuit turns on the pull-up section 210 in response to a carry signal provided from an (m−1)-th stage SRCm−1, and turns off the pull-up section 210 in response to a gate signal Gm+1 of an (m+1)-th stage SRCm+1. The pull-up driving circuit includes a buffer section 280, a charging section 270 and a discharging section 230.

The buffer section 280 includes a thirteenth transistor T13 having a gate electrode connected to the first input terminal IN1, a drain electrode connected to the first input terminal IN1, and a source electrode connected to the first node N1.

When the thirteenth transistor T13 is turned on in response to the carry signal of the (m−1)-th stage SRCm−1, the carry signal is applied to the first node N1 to raise a voltage level of the first node N1 to charge the third capacitor C3. When the third capacitor C3 is sufficiently charged to have a higher voltage than the threshold voltage of the fifth transistor T5 and the first clock signal CL is high, the fifth transistor T5 is bootstrapped, so that the first clock signal of a high level is outputted to the output terminal OUT and the m-th gate signal Gm of the m-th stage SRCm is outputted.

The thirteenth transistor T13 has sufficient channel width, so that when the thirteenth transistor T13 is turned on, the third capacitor C3 electrically connected to the third capacitor C3 is charged enough to enhance driving characteristics. The amount of change of the channel width of the thirteenth transistor T13 will be explained in detail.

Figure 10A:
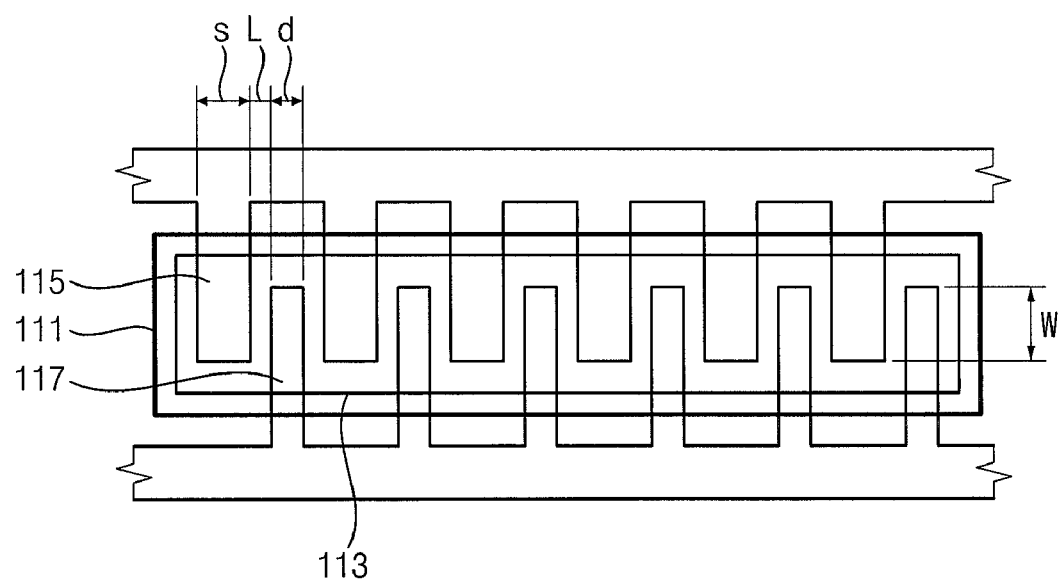
FIGS. 10A and 10B are plan views illustrating structures of the ninth transistor in FIG. 9.
Figure 10B:
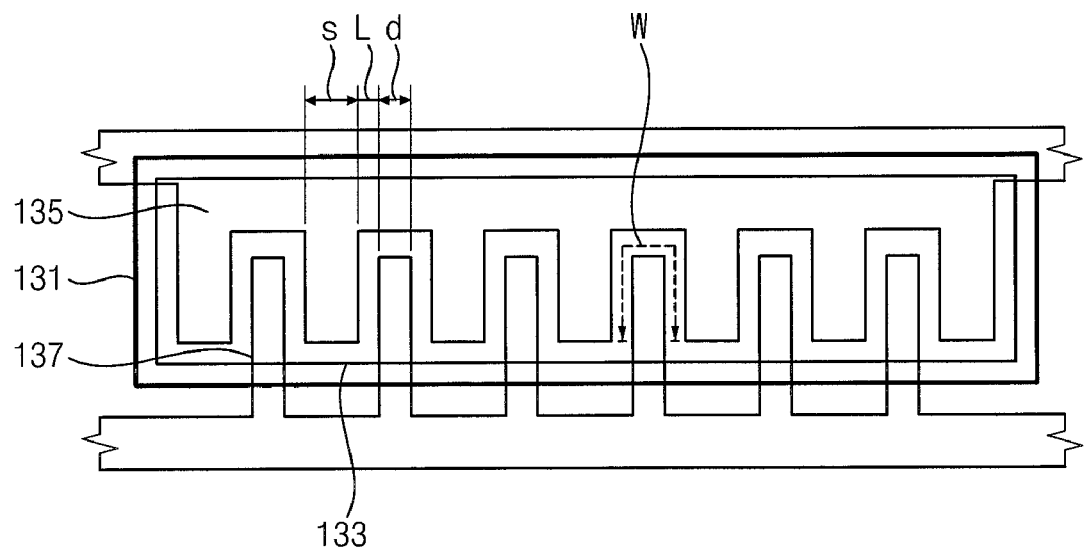

FIGS. 10A and 10B are plan views illustrating structures of the ninth transistor in FIG. 9.

Referring to FIG. 10A, the ninth transistor T9 in FIG. 9 has a channel of an I-shape. In detail, the ninth transistor T9 includes a gate electrode 111, a channel pattern 113, a plurality of source electrodes 115 and a plurality of drain electrodes 117. The channel pattern 113 is disposed on the gate electrode 111. A portion of the source electrodes 115 and the drain electrodes 117 is overlapped with the channel pattern 113.

Each of the source electrodes 115 and the drain electrodes 117 has an I-shape and the source electrodes 115 and the drain electrodes 117 are alternately arranged with each other. The source electrodes 115 and the drain electrodes 117 are separated from each other. The channel defined by the source electrodes 115 and the drain electrodes 117 has an I-shape with a channel length L and a channel width W.

The ninth transistor T9 is designed such that a width s of the source electrode 115 is greater than a width d of the drain electrode 117. Therefore, the parasitic capacitance Cgs between the gate electrode 111 and the source electrode 115 becomes greater than the parasitic capacitance Cgd between the gate electrode 111 and the drain electrode 117.

Referring to FIG. 10B, the ninth transistor T9 in FIG. 9 has a channel with a U-shape. In detail, the ninth transistor T9 includes a gate electrode 131, a channel pattern 133, a plurality of source electrodes 135 and a plurality of drain electrodes 137. The channel pattern 133 is formed on the gate electrode 131. The source electrodes 133 and the drain electrodes 137 are formed such that a portion of the source electrodes 133 and the drain electrodes 137 is overlapped with the channel pattern 133.

Each of the source electrodes 135 has a U-shape, and each of the drain electrodes 137 is inserted into each of the source electrodes 135. As a result, the channel layer defined by the source electrodes 135 and the drain electrodes 137 has a U-shape with a channel length L and a channel width W.

The ninth transistor T9 is designed such that the width s of the each of the source electrodes 135 is greater than the width d of each of the drain electrodes 137. Therefore, the parasitic capacitance Cgs between the gate electrode 131 and each of the source electrodes 135 becomes greater than the parasitic capacitance Cgd between the gate electrode 131 and each of the drain electrodes 137.

As shown in FIGS. 10A and 10B, when the parasitic capacitance Cgs between the gate electrode and the source electrode becomes greater than the parasitic capacitance Cgd between the gate electrode and the drain electrode, the ripple of the first node N1 that is electrically connected to the source electrode of the ninth transistor is reduced. A ratio of the parasitic capacitance Cgs between the gate electrode and the source electrode to the parasitic capacitance Cgd between the gate electrode and the drain electrode is K:1 (K>1), for example about 2:1, about 3:1 or about 4:1.

Figure 11:
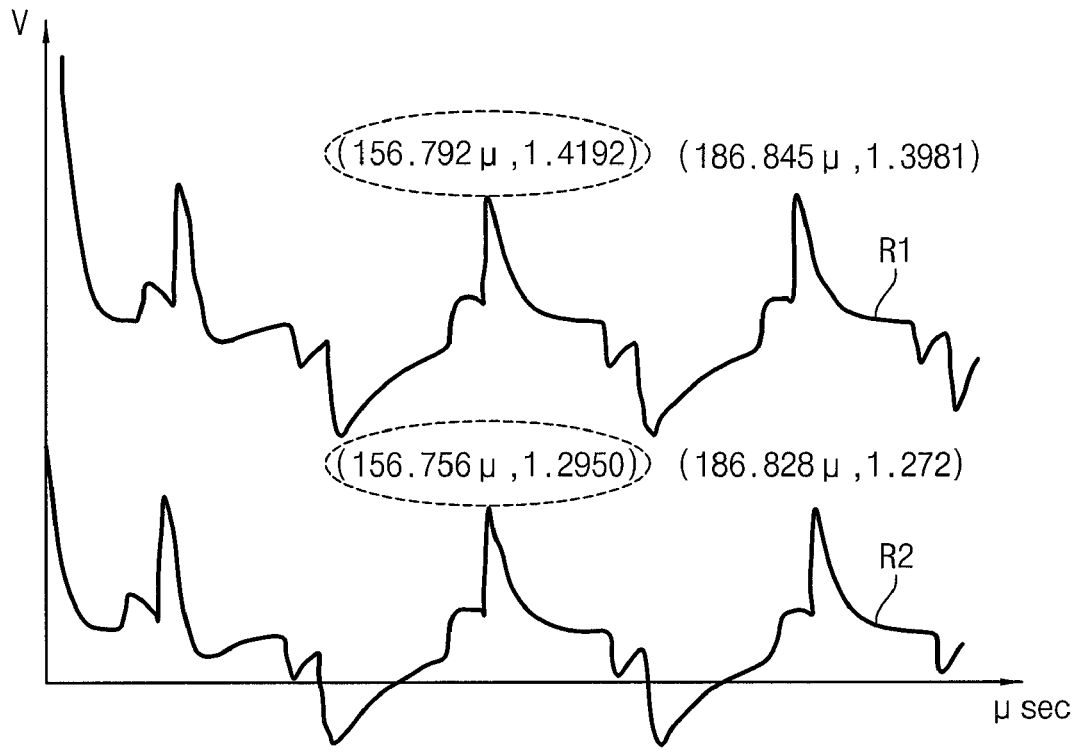
FIG. 11 is a graph showing simulated voltage ripples at the first node in FIG. 9.

FIG. 11 is a graph showing simulated voltage ripples at a first node in FIG. 9.

The graph in FIG. 11 was measured from the first node N1 of the stage adopting the fifth transistor T5 having a channel width W of about 3,500 μm, the ninth transistor T9 having a channel width W of about 400 μm, the fifth transistor T5 having the channel length L of about 5 μm to about 6 μm, and the ninth transistor T9 having a channel length L that is substantially the same as the fifth transistor T5.

Referring to FIG. 11, a first ripple pattern R1 corresponds to the ratio of the parasitic capacitance Cgs between the gate and source electrodes of the ninth transistor T9 to the parasitic capacitance Cgd between the gate and drain electrodes of the ninth transistor T9 is about 1:1. A second ripple pattern R2 corresponds to the ratio of the parasitic capacitance Cgs between the gate and source electrodes of the ninth transistor T9 to the parasitic capacitance Cgd between the gate and drain electrodes of the ninth transistor T9 is about 2:1.

Referring to the first ripple pattern R1, when the ratio of the parasitic capacitance Cgs between the gate and source electrodes of the ninth transistor T9 to the parasitic capacitance Cgd between the gate and drain electrodes of the ninth transistor T9 is about 1:1, the voltage difference Vgs between the gate and source electrodes of the fifth transistor T3 in FIG. 3 (or a voltage of the first node N1) is raised to about 1.41 V. Referring to the second ripple pattern R2, when the ratio of the parasitic capacitance Cgs between the gate and source electrodes of the ninth transistor T9 to the parasitic capacitance Cgd between the gate and drain electrodes of the ninth transistor T9 is about 2:1, the voltage difference Vgs between the gate and source electrodes of the fifth transistor T3 in FIG. 3 (or a voltage of the first node N1) is raised to about 1.29 V. That is, a peak of the second ripple pattern R2 is reduced by about 0.12 V in comparison with a peak of the first ripple pattern R1.

As a result, when the ratio of the parasitic capacitance Cgs between the gate and source electrodes of the ninth transistor T9 to the parasitic capacitance Cgd between the gate and drain electrodes of the ninth transistor T9 is increased to be about 2:1, the peak of the ripple measured at the first node N1 is decreased.

The following Table 3 shows data of transistors in FIG. 9 when the transistors are driven for 3,000 hours.

TABLE 3

| | DRAIN | GATE | SOURCE | ROLE | Vth (Id > 1 nA) |
|---|---|---|---|---|---|
| T5 | CK/CKB | VSS | VSS | GATE OUTPUT | 6 |
| T6 | VSS | VSS | VSS | GATE RESET | 6 |
| T11 | VSS | INV. OUT | VSS | GATE HOLD1 | 7.5 |
| T13 | VSS | VSS | VSS | T5 GATE CHARGE | 3 |
| T10 | VSS | CK/CKB | VSS | GATE HOLD2 | 21.5 |
| T18 | VSS | CK/CKB | VSS | T5 GATE HOLD1 | 22.5 |
| T9 | VSS | CK/CKB | VSS | T5 GATE HOLD2 + CARRY FORWARD | 21 |
| T14 | CK/CKB | VSS | VSS | CARRY | 9 |

Referring to Table 3, the ninth, tenth and eighteenth transistors T9, T10 and T18, which receive the first and second clock signals CK and CKB, are deteriorated due to gate bias stress, so that the threshold voltage Vth is shifted in comparison with other transistors to lower driving ability.

That is, when the channel width W of the ninth transistor T9 increases, a driving ability of the fifth transistor T5 is deteriorated.

Considering the driving characteristics of the ninth transistor T9, the ratio of the parasitic capacitance Cgs to the parasitic capacitance Cgd of the transistor T9 is increased not increasing the channel width of the ninth transistor T9, and the channel width of the thirteenth transistor T13, of which a threshold voltage Vth is relatively less shifted, is increased so that the fifth transistor T5 may be sufficiently charged, according to the present invention.

The thirteenth transistor T13 charges the third capacitor C3 electrically connected to the first node N1 when the thirteenth transistor T13 is turned on as well as the ninth transistor T9. By increasing the channel width of the thirteenth transistor T13, the fifth transistor T5 may be charged enough to enhance driving reliability even when the stages are driven for a long time.

In general, a conventional thirteenth transistor T13 has a channel width of about 1,200 micrometers (μm). Therefore, the thirteenth transistor T13 according to the present embodiment has a channel width of no less than about 1,200 μm within an allowed area limitation.

Preferably, as described in the first example embodiment in FIG. 3 and the second example embodiment in FIG. 8, the width of the thirteenth transistor T13 is increased as much as an amount $\Delta W_{T9}$, which corresponds to an increased amount of channel of the ninth transistor T9.

The amount $\Delta W_{T9}$ is represented as the following Equation 1.

$$\Delta W_{T9} = W_{T9}(1-1/K),\qquad \text{Equation 1}$$

Wherein $W_{T9}$ is a channel width of the ninth transistor T9, when the ratio Cgs to Cgd is about 1:1 (or symmetric).

The amount $\Delta W_{T9}$ corresponds to a reduced amount of the channel width in comparison with $W_T$ of the ninth transistor T9 having the ratio Cgs to Cgd is about 1:1, when the Cgd of the ninth transistor T9 is reduced without changing the Cgs such that the ratio Cgs to Cgd is about K:1 (K>1).

For example, when the channel width $W_T$ is about 900 μm of the ninth transistor T9 having the ratio Cgs:Cgd is about 1:1, the ripple of the first node N1 may be reduced when the ninth transistor T9 is designed such that the ratio Cgs:Cgd is about 3:1 without changing the channel width of the ninth transistor T9. In this case, the channel width of the thirteenth transistor T13 is increased by 600 μm ($\Delta W_{T9}$=900 μm (1−⅓)=600 μm).

A range of the amount $\Delta W_{T9}$ may be expressed as the following Equation 2 in accordance with an equation $W_{T8} < W_{T9} < W_{T8}+W_{T14}$ through which the channel width of the ninth transistor T9 is obtained.

$$W_{T8} \times (1-1/K) < \Delta W_{T9} = W_{T9} \times (1-1/K) < (W_{T8}+W_{T14}) \times (1-1/K) \qquad \text{Equation 2}$$

Wherein $W_{T8}$ is a width of the eighth transistor T8, and $W_{T14}$ is a width of the fourteenth transistor T14.

Figure 12:
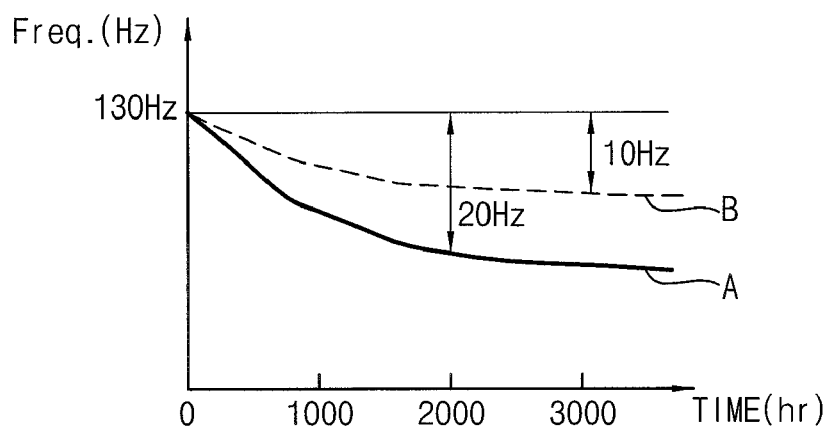
FIG. 12 is a graph illustrating frequency characteristics of a gate driving circuit according to operating time.

FIG. 12 is a graph illustrating frequency characteristics of a gate driving circuit according to operating time.

Referring to FIG. 12, comparative example A employs the ninth transistor T9 of which a ratio of the parasitic capacitance Cgs between the gate and source electrodes to the parasitic capacitance Cgd between the gate and drain electrodes is about 1:2 or about 1:3, and the thirteenth transistor T13, which is substantially the same as the conventional one, having the channel width of about 1,200 μm. Example B according to the present invention employs the ninth transistor T9 of which a ratio of the parasitic capacitance Cgs between the gate and source electrodes to the parasitic capacitance Cgd between the gate and drain electrodes is about 1:2 or about 1:3, and the thirteenth transistor T13 having the channel width of about 1,600 μm.

According to comparative example A, the driving frequency is about 130 Hz at first, but lowered by about 20 Hz after being driven for about 2,000 hours. However, according to example B according to the present invention, the driving frequency is 130 Hz at first like comparative example A, but lowered by about 10 Hz after being driven for about 2,000 hours. Example B has a reduced frequency drop in comparison with comparative example A.

As a result, when the channel width of the thirteenth transistor T13 is increased, the first node N1 driving the pull-up section is fully charged to enhance driving reliability.

According to an embodiment of the present invention, the width-to-length ratio (W/L) of a transistor in a second holding section is increased, and as a result the reverse ripple increases so that the total ripple occurring at a control electrode of a pull-up section may be decreased. Therefore, generation of an abnormal gate-on signal may be prevented, to reduce driving defects of a display apparatus. In addition, as the width-to-length ratio (W/L) of the transistor in the second holding section is increased, the charging rate of a charging section may be enhanced, so that a low temperature driving margin may be improved.

According to another embodiment, a parasitic capacitance between gate and source electrodes of a ninth transistor is increased to reduce a ripple of a first node electrically connected to the source electrode of the ninth transistor.

Additionally, a channel width of a thirteenth transistor electrically charging a capacitor connected to the first node is increased to sufficiently charge the capacitor. As a result, the reliability of the gate driving circuit outputting the gate signal may be enhanced.

Having described illustrative examples in accordance with the disclosure and their advantages, it is noted that various changes, substitutions and alterations can be made thereto without departing from the spirit and scope of the present teachings.

What is claimed is:

1. A gate driving circuit comprising a shift register that has a plurality of stages cascade-connected to each other, the plurality of stages comprising one or more stages, each of which comprises:
    a pull-up section receiving a first clock signal, and passing the first clock signal as a gate signal when a first node signal is driven to a high voltage in response to a first input signal;
    a pull-down section discharging the gate signal to an off-voltage in response to a second input signal;
    a discharging section discharging the first node signal to the off-voltage in response to the second input signal;
    a first holding section responsive to the first clock signal, maintaining the first node signal at the off-voltage when the gate signal has been discharged to the off-voltage; and
    a second holding section responsive to a second clock signal, maintaining the first node signal at the off-voltage when the first input signal is at the off-voltage,
    wherein the second holding section has a greater transistor width-to-length ratio than the first holding section;
    said one or more stages each further comprising a carry section passing the first clock signal as a carry signal in response to the first node signal, wherein the second holding section has a smaller transistor width-to-length ratio than a sum of transistor width-to-length ratios of the first holding section and the carry section.

2. The gate driving circuit of claim 1, further comprising:
    a third holding section maintaining the gate signal at the off-voltage in response to the second clock signal;

a fourth holding section maintaining the gate signal at the off-voltage alternately with the third holding section; and a switching section switching the fourth holding section on and off.

3. The gate driving circuit of claim 2, wherein the switching section comprises:

a first transistor having a drain electrode, a gate electrode and a source electrode, the drain and gate electrodes being simultaneously receiving the first clock signal;

a second transistor having a drain electrode connected to the source electrode of the first transistor, and having a gate electrode receiving the gate signal, and a source electrode receiving the off-voltage;

a third transistor having a drain electrode receiving the first clock signal, a gate electrode connected to the source electrode of the first transistor, and a source electrode;

a fourth transistor having a drain electrode connected to the source electrode of the third transistor at a second node, a gate electrode receiving the gate signal simultaneously with the gate electrode of the second transistor, and a source electrode receiving the off-voltage;

a first capacitor connecting the drain electrode of the third transistor to the gate electrode of the third transistor; and a second capacitor connecting the gate electrode of the third transistor to the source electrode of the third transistor, wherein the fourth holding section is switched on and off in response to a second node signal.

4. The gate driving circuit of claim 3, wherein the one or more stages comprise an m-th stage;

the first input signal of the m-th stage is a vertical start signal or is the carry signal of the (m−1)-th stage, and the second input signal of the m-th stage is the gate signal of the (m+1)-th stage or the vertical start signal.

5. The gate driving circuit of claim 3, wherein the first clock signal is opposite in phase to the second clock signal.

6. The gate driving circuit of claim 2, wherein the one or more stages comprise an m-th stage;

the first input signal of the m-th stage is a vertical start signal or is the gate signal of the (m−1)-th stage, and the second input signal of the m-th stage is the gate signal of the (m+1)-th stage or the vertical start signal.

7. A display apparatus comprising:

a display panel including a display area displaying an image and a peripheral area surrounding the display area, a plurality of pixel areas being formed in the display area by gate lines and data lines transverse to the gate lines;

a data driving circuit outputting data signals to the data lines; and a gate driving circuit having a plurality of stages cascade-connected to each other and directly integrated on the peripheral area, each of the stages outputting a gate signal to the gate lines, wherein the plurality of stages comprises one or more stages, each of which comprises:

a pull-up section passing a first clock signal as a gate signal in response to a first node signal driven to a high level in response to a first input signal;

a pull-down section discharging the gate signal to an off-voltage in response to a second input signal;

a discharging section discharging the first node signal to the off-voltage in response to the second input signal;

a first holding section maintaining the first node signal at the off-voltage of the gate signal in response to the first clock signal; and a second holding section maintaining the first node signal at the off-voltage of the first input signal in response to the second clock signal, wherein the second holding section has a greater transistor width-to-length ratio than the first holding section, the one or more stages each further comprising a carry section passing the first clock signal as a carry signal in response to the first node signal, wherein the transistor width-to-length ratio of the second holding section is smaller than a sum of transistor width-to-length ratios of the first holding section and the carry section.

8. The display apparatus of claim 7, further comprising:

a third holding section maintaining the gate signal at the off-voltage in response to the second clock signal;

a fourth holding section maintaining the gate signal at the off-voltage alternately with the third holding section; and a switching section switching the fourth holding section on and off.

9. The display apparatus of claim 8, wherein the switching section comprises:

a first transistor having a drain electrode, a gate electrode and a source electrode, the drain and gate electrodes being simultaneously receiving the first clock signal;

a second transistor having a drain electrode connected to the source electrode of the first transistor, a gate electrode receiving the gate signal, and a source electrode receiving the off-voltage;

a third transistor having a drain electrode receiving the first clock signal, a gate electrode connected to the source electrode of the first transistor, and a source electrode;

a fourth transistor having a drain electrode connected to the source electrode of the third transistor at a second node, a gate electrode receiving the gate signal simultaneously with the gate electrode of the second transistor, and a source electrode receiving the off-voltage;

a first capacitor connecting the drain electrode of the third transistor to the gate electrode of the third transistor; and a second capacitor connecting the gate electrode of the third transistor to the source electrode of the third transistor, wherein the fourth holding section is switched on and off by a second node signal.

10. The display apparatus of claim 9, wherein the one or more stages comprise an m-th stage;

wherein the first input signal of the m-th stage is a vertical start signal or is the carry signal of an (m−1)-th stage, and the second input signal of the m-th stage is the gate signal of an (m+1)-th stage or the vertical start signal.

11. The display apparatus of claim 10, wherein the first clock signal is opposite in phase opposite to the second clock signal.

12. The display apparatus of claim 9, wherein the one or more stages comprise an m-th stage;

wherein the first input signal of the m-th stage is a vertical start signal or is the gate signal of an (m−1)-th stage, and the second input signal of the m-th stage is the gate signal of an (m+1)-th stage or the vertical start signal.

13. A gate driving circuit comprising a shift register that has a plurality of stages cascade-connected to each other, each stage comprising:

a pull-up section connected to a first clock terminal connecting the first clock terminal to an output terminal providing a gate signal when a first node is driven to a high voltage in response to a signal on a first input terminal;

a pull-down section discharging the output terminal to an off-voltage in response to a signal on a second input terminal;

a discharging section discharging the first node to the off-voltage in response to the signal on the second input terminal;

a first holding section responsive to a signal on the first clock terminal, the first holding section maintaining the first node at the off-voltage when the output terminal has been discharged to the off-voltage; and a second holding section responsive to a signal on a second clock terminal, the second holding section maintaining the first node at the off-voltage when the first input terminal is at the off-voltage, wherein the first holding section includes a first holding section transistor having a respective first transistor width-to-length ratio, wherein the second holding section includes a second holding section transistor having a respective second transistor width-to-length ratio that is greater than the first transistor width-to-length ratio, the second holding section transistor further being an asymmetric transistor having a parasitic gate-to-source capacitance (Cgs) and a parasitic gate-to-drain capacitance (Cgd), where the parasitic gate-to-source capacitance is greater than the parasitic gate-to-drain capacitance (Cgs>Cgd), and wherein said plurality of stages each further comprises a carry section passing the first clock signal as a carry signal in response to the first node signal, wherein the second holding section has a smaller transistor width-to-length ratio than a sum of transistor width-to-length ratios of the first holding section and the carry section.

14. A display apparatus comprising the gate driving circuit of claim 13 and further comprising:

a plurality of gate lines, each of which is connected to the output terminal of a respective one of the one or more stages;

a plurality of data lines transverse to the gate lines; and a data driving circuit providing data signals to the data lines.

15. A display apparatus comprising:

a display panel having a pixel region in which a plurality of gate lines and a plurality of data lines, and a peripheral region surrounding the pixel region;

a data driving section applying data signals to the data lines; and a gate driving circuit applying gate signals to the gate lines, the gate driving circuit comprising a plurality of stages cascade-connected to each other, an m-th stage (wherein 'm' is an integer) comprising:

a pull-up section receiving a first clock signal, and passing the first clock signal as a gate signal when a first node signal is driven to a high voltage in response to a first input signal;

a pull-down section discharging the gate signal to an off-voltage in response to a second input signal;

a discharging section discharging the first node signal to the off-voltage in response to the second input signal;

a first holding section responsive to the first clock signal, maintaining the first node signal at the off-voltage when the gate signal has been discharged to the off-voltage; and a second holding section responsive to a second clock signal, maintaining the first node signal at the off-voltage when the first input signal is at the off-voltage, the second holding section including an asymmetric transistor, wherein said plurality of stages each further comprises a carry section passing the first clock signal as a carry signal in response to the first node signal, wherein the second holding section has a smaller transistor width-to-length ratio than a sum of transistor width-to-length ratios of the first holding section and the carry section.

16. The display apparatus of claim 15, wherein the asymmetric transistor of the second holding section comprises a gate electrode receiving the second clock signal, a drain electrode receiving the first input signal and a source electrode electrically connected to the first node, and a first parasitic capacitance between the gate and source electrodes of the asymmetric transistor is greater than a second parasitic capacitance between the gate and drain electrodes of the asymmetric transistor.

17. The display apparatus of claim 16, further comprising a buffer section comprising a transistor electrically connected to the first node to apply the first input signal of a high level to the first node.

18. The display apparatus of claim 17, wherein an increased width $\Delta WT$ of the transistor of the buffer section satisfies the following equation, $$WT8 \times (1-1/K) < \Delta WT$$

wherein WT8 is a channel width of the first holding section, a ratio of a parasitic capacitance Cgs between gate and source electrodes of a transistor of the second holding section to a parasitic capacitance Cgd between gate and drain electrodes of the transistor of the second holding section is K:1 (K>1).

19. The display apparatus of claim 17, further comprising a carry section outputting the first clock signal as a carry signal in response to a signal of the first node.

20. The display apparatus of claim 19, wherein an increased width $\Delta WT$ of the transistor of the buffer section satisfies the following equation, $$WT8 \times (1-1/K) < \Delta WT < (WT8+WT14) \times (1-1/K),$$

wherein WT8 is a channel width of the first holding section, WT14 is a channel width of the carry section, and a ratio of a parasitic capacitance Cgs between gate and source electrodes of a transistor of the second holding section to a parasitic capacitance Cgd between gate and drain electrodes of the transistor of the second holding section is K:1 (K>1).

21. The display apparatus of claim 20, wherein the first input signal corresponds to a vertical start signal or a carry signal of an (m−1)-th stage, and the second input signal corresponds to a gate signal of an (m+1)-th stage or the vertical start signal.

22. The display apparatus of claim 15, wherein the first input signal corresponds to a vertical start signal or a gate signal of an (m−1)-th stage, and the second input signal corresponds to a gate signal of an (m+1)-th stage or the vertical start signal.

* * * * *